(12) United States Patent
Van Schoot et al.

(10) Patent No.: US 9,785,051 B2
(45) Date of Patent: Oct. 10, 2017

(54) ACTUATION MECHANISM, OPTICAL APPARATUS, LITHOGRAPHY APPARATUS AND METHOD OF MANUFACTURING DEVICES

(71) Applicant: ASML Netherlands B.V., Veldhoven (NL)

(72) Inventors: Jan Bernard Plechelmus Van Schoot, Veldhoven (NL); Sven Antoin Johan Hol, Eindhoven (NL); Edwin Johan Buis, Belfeld (NL); Erik Maria Rekkers, Boxtel (NL); Gosse Charles De Vries, Veldhoven (NL); Hako Botma, Veldhoven (NL); Marinus Johannes Maria Van Dam, Veldhoven (NL); Ramon Pascal Van Gorkom, Veldhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 36 days.

(21) Appl. No.: 14/435,450

(22) PCT Filed: Sep. 17, 2013

(86) PCT No.: PCT/EP2013/069301
§ 371 (c)(1),
(2) Date: Apr. 13, 2015

(87) PCT Pub. No.: WO2014/060170
PCT Pub. Date: Apr. 24, 2014

(65) Prior Publication Data
US 2015/0277233 A1 Oct. 1, 2015

Related U.S. Application Data

(60) Provisional application No. 61/843,263, filed on Jul. 5, 2013, provisional application No. 61/757,585, filed
(Continued)

(51) Int. Cl.
*G03F 7/20* (2006.01)
*G02B 7/182* (2006.01)
(Continued)

(52) U.S. Cl.
CPC .......... *G03F 7/70091* (2013.01); *G01C 9/06* (2013.01); *G02B 7/1821* (2013.01);
(Continued)

(58) Field of Classification Search
CPC .. H02K 2201/18; H02K 41/031; H02K 41/03; H02K 7/09; H02K 16/00;
(Continued)

(56) References Cited

U.S. PATENT DOCUMENTS 5,270,737 A 12/1993 Nakasugi et al.
6,059,250 A 5/2000 Reuter et al.
(Continued)

FOREIGN PATENT DOCUMENTS

CN 101373338 2/2009
CN 102257421 A 11/2011
(Continued)

OTHER PUBLICATIONS

Chinese Office Action issued Apr. 30, 2015 for corresponding Chinese Patent Application No. 201380063824.7 (23 pages).
(Continued)

*Primary Examiner* — Michelle M Iacoletti
(74) *Attorney, Agent, or Firm* — Pillsbury Winthrop Shaw Pittman LLP

(57) ABSTRACT

An actuator to displace, for example a mirror, provides movement with at least two degrees of freedom by varying the currents in two electromagnets. A moving part includes a permanent magnet with a magnetic face constrained to move over a working area lying substantially in a first plane perpendicular to a direction of magnetization of the magnet. The electromagnets have pole faces lying substantially in a second plane closely parallel to the first plane, each pole face substantially filling a quadrant of the area traversed by the face of the moving magnet. An optical position sensor may direct a beam of radiation at the moving magnet through a central space between the electromagnets. The sizes of facets in a pupil mirror device may be made smaller in a peripheral region, but larger in a central region, thereby relaxing focusing requirements.

29 Claims, 14 Drawing Sheets

Related U.S. Application Data on Jan. 28, 2013, provisional application No. 61/713,930, filed on Oct. 15, 2012.

(51) Int. Cl.

| | |
|---|---|
| *H02K 41/00* | (2006.01) |
| *G01C 9/06* | (2006.01) |
| *H01F 7/02* | (2006.01) |
| *H01F 7/20* | (2006.01) |
| *H01H 51/22* | (2006.01) |

(52) U.S. Cl.
CPC ........ *G03F 7/70116* (2013.01); *H01F 7/0231* (2013.01); *H01F 7/206* (2013.01); *H02K 41/00* (2013.01); *G01C 2009/066* (2013.01); *H01H 2051/2218* (2013.01)

(58) Field of Classification Search
CPC ...... H02K 41/02; H02K 16/02; H02K 1/2793; H02K 21/24; H02K 29/03; H02K 3/28; H02K 9/19; H02K 49/106; H02K 11/40; H02K 1/148; H02K 1/2733; H02K 41/0354; H02K 41/0356; H02K 49/10; H02K 7/08; G03F 7/70758; G03F 7/70716; G03F 7/70775; G03F 7/70516; G03F 7/70116; G03F 7/70733; G03F 7/70091; G03F 7/7015; G03F 7/70825; G03F 7/70833; Y10T 74/20317; G02B 7/1821; G02B 7/1828; H01F 7/0205; H01F 7/0231; H01F 7/206
See application file for complete search history.

(56) References Cited

U.S. PATENT DOCUMENTS

| | | | |
|---|---|---|---|
| 6,208,045 B1 | 3/2001 | Hazelton et al. | |
| 6,891,600 B2 | 5/2005 | Frissen et al. | |
| 7,149,427 B1 | 12/2006 | Dewa et al. | |
| 7,277,158 B2 | 10/2007 | Dierichs | |
| 7,312,459 B2 | 12/2007 | Amemiya et al. | |
| 7,696,653 B2 | 4/2010 | Tanaka | |
| 7,999,920 B2 | 8/2011 | Ye et al. | |
| 8,593,645 B2 | 11/2013 | Patra | |
| 8,854,604 B2 | 10/2014 | Deguenther et al. | |
| 2002/0074516 A1* | 6/2002 | Novak | G03F 7/70716 250/491.1 |
| 2005/0030653 A1 | 2/2005 | Holderer et al. | |
| 2007/0081136 A1* | 4/2007 | Hara | G03B 27/42 355/53 |
| 2010/0066992 A1* | 3/2010 | Ono | G03F 7/70758 355/72 |
| 2010/0253930 A1* | 10/2010 | Ito | G03B 27/58 355/72 |
| 2012/0044474 A1 | 2/2012 | Hauf et al. | |

FOREIGN PATENT DOCUMENTS

| | | |
|---|---|---|
| CN | 102483581 A | 5/2012 |
| DE | 102011076658 | 5/2012 |
| EP | 0 444 651 A2 | 9/1991 |
| JP | 2001-264036 | 9/2001 |
| JP | 2002-323584 | 11/2002 |
| JP | 2005-268035 | 9/2005 |
| JP | 2006-165552 | 6/2006 |
| JP | 2006-332562 | 12/2006 |
| JP | 2008-61493 | 3/2008 |
| JP | 2012-506135 | 3/2012 |
| JP | 2012-520554 | 9/2012 |
| JP | 2012-533871 | 12/2012 |
| JP | 2013-503461 | 1/2013 |
| WO | WO 2008/131930 | 11/2008 |
| WO | 2007/113955 | 8/2009 |
| WO | WO 2011/000671 | 1/2011 |
| WO | WO 2011/023419 | 3/2011 |
| WO | WO 2011/023423 | 3/2011 |

OTHER PUBLICATIONS

International Preliminary Report on Patentability and Written Opinion mailed Apr. 30, 2015 for corresponding International Patent Application No. PCT/EP2013/069301 (9 pages).
Ishikawa et al, "Integrated micro-displacement sensor that measures tilting angle and linear movement of an external mirror", Sensors and Actuators A: Physical, vol. 138, Issue 2, Aug. 26, 2007, pp. 269-275.
International Search Report mailed Apr. 2, 2014 for corresponding International Patent Application No. PCT/EP2013/069301 (7 pages).
English translation of Taiwan Office Action dated May 5, 2017 for corresponding Taiwan Patent Application No. 102136606 (4 pages).
Japanese Office Action dated Jul. 31, 2017 for corresponding Japanese Patent Application No. 2015-536040 (9 pages).

\* cited by examiner

ACTUATION MECHANISM, OPTICAL APPARATUS, LITHOGRAPHY APPARATUS AND METHOD OF MANUFACTURING DEVICES

CROSS-REFERENCE TO RELATED APPLICATIONS

This application is the U.S. national phase entry of International Patent Application No. PCT/EP2013/069301, which was filed on 17 Sep. 2013, which claims the benefit of U.S. provisional application 61/713,930, which was filed on 15 Oct. 2012 and U.S. provisional application 61/757,585 which was filed on 28 Jan. 2013 and U.S. provisional application 61/843,263 which was filed 5 Jul. 2013, and which is are incorporated herein in their entireties by reference.

FIELD

An embodiment of the invention relates to actuation mechanisms that may be applied in a range of apparatuses and instruments. An embodiment of the invention relates to an optical position sensor. An embodiment of the invention relates to an optical system with a faceted field mirror device and/or a faceted pupil mirror device.

BACKGROUND

Lithography is widely recognized as one of the key steps in the manufacture of integrated circuits (ICs) and other devices and/or structures. However, as the dimensions of features made using lithography become smaller, lithography is becoming a more critical factor for enabling miniature IC or other devices and/or structures to be manufactured.

A lithographic apparatus is a machine that applies a desired pattern onto a substrate, usually onto a target portion of the substrate. A lithographic apparatus can be used, for example, in the manufacture of ICs. In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

In a lithographic apparatus, many moving parts are typically provided with various degrees of freedom, and the motions and locations (including linear and angular positions (orientation), velocities and accelerations) are controlled automatically via numerous actuation mechanisms (actuators). Actuators may be electromagnetically, pneumatically, or hydraulically operated. Actuators are often constrained to effect movement in only one degree of freedom (linear or rotational). Where the moving parts are to be controlled in a plurality of degrees of freedom, more complex mechanisms may be provided, or multiple single-degree mechanisms may be combined.

In order to shorten the exposure wavelength and, thus, reduce the minimum printable size, it has been proposed to use an extreme ultraviolet (EUV) radiation source. EUV radiation sources are typically configured to output radiation wavelengths of around 5-20 nm, for example, 13.5 nm or about 13 nm or 6.5-6.8 nm. Use of EUV radiation may constitute a significant step toward achieving small features printing. Such radiation is termed extreme ultraviolet or soft x-ray, and possible sources include, for example, laser-produced plasma sources, discharge plasma sources, or synchrotron radiation from electron storage rings. Because of the desire for extreme accuracy, and because additionally of the desire to work in a vacuum environment with high reliability, designing actuators for EUV lithography apparatus is particularly challenging.

SUMMARY

An example where actuators are used is for a faceted mirror of an illumination system of an EUV optical apparatus. Numerous individual mirror facets may be provided in an array, each of which may need to be oriented in different directions to effect different illumination profiles at a target location. Actuators for field facet mirrors are described, for example, in the PCT patent application publication no. WO 2011/000671 A1. When seeking to extend the range of illumination profiles that can be achieved, actuators having more than two positions are desired, which may include movements in two or more degrees of freedom, and may need intermediate positions that cannot be defined by end stops. Thus, such an actuator is desired, which meets stringent requirements of size, cost and heat dissipation, as well as performance.

Other issues arise in the design of such an illumination system. The position of the moving mirror or other element should be measured in two dimensions, rather than being set in one dimension by, for example, an end stop. When there are potentially hundreds of individual facets to be controlled, and especially when these are in a vacuum environment, providing sufficiently accurate and compact position measurement and feedback control becomes challenging. If radiation is not to be discarded, the increase in the number of illumination profiles implies an increase in the number of facet mirrors. Given that the pupil as a whole has a fixed size, and that for some illumination modes a small pupil fill ratio is desired, each pupil facet mirror may become quite small and it is then a challenge for the field facet mirrors to focus radiation onto all of the associated pupil facet mirrors.

According to an aspect, there is provided an actuation mechanism to provide movement with two degrees of freedom, the mechanism comprising a moving part and a static part, the moving part including a permanent magnet with a magnetic face constrained to move over a working area lying substantially in a first plane perpendicular to a direction of magnetization of the magnet, the static part comprising at least two electromagnets having pole faces lying substantially in a second plane closely parallel to the first plane, the pole faces being symmetrically distributed around a central position in the second plane and extending over substantially the whole area traversed by the face of the moving magnet.

In an embodiment, each electromagnet is a bipolar electromagnet having first and second pole faces located diametrically opposite one another in the second plane. The number of electromagnet pole faces may be four, each of the pole faces having substantially the form of a quadrant of a circle or annulus, the pole faces together substantially covering a circular area in the second plane.

A ferromagnetic shield may surround at least the permanent magnet so as to shield it from magnetism when a plurality of such actuator mechanisms are placed side-by-side.

An optical position sensor may be arranged to direct a beam of radiation at the moving magnet through a central space between the electromagnets to detect deflection of one or more beams of radiation reflected from the moving magnet.

Various features disclosed here enable the provision of, for example, EUV-compatible actuators in a compact, elongate form suitable for use in close array with one another (allowing thus a dens packing). In an embodiment, each actuator comprises a suspension section, the permanent magnet, the static part of the actuator and an optical position sensor stacked end-to-end. An embodiment of the invention may be used in combination with a stiffness compensation arrangement described in the U.S. provisional patent application No. 61/713,930, mentioned above.

According to an aspect, there is provided an optical apparatus comprising a series of optical components arranged to receive a radiation beam from a radiation source to process and deliver the beam to a target location, wherein the optical components include one or more movable optical components coupled to (mounted on) an actuator mechanism as described herein, and wherein a controller and drive circuitry are provided to energize the electromagnets to achieve a desired positioning of the, or each movable optical component.

The movable optical component may form an illumination system to condition the beam and deliver the conditioned beam to a target location on a patterning device, wherein the movable component is movable to vary an incidence angle of the conditioned beam at the target location. In an embodiment, a plurality of such movable components with associated actuation mechanisms are provided as part of a fly's eye illuminator.

Embodiments of the invention may find particular application where the optical components are reflective components and the illumination system is an EUV illumination system operable with radiation with a wavelength in the range 5 to 20 nm.

According to an aspect, there is provided a lithographic apparatus that includes an illumination system configured to condition a radiation beam; a support constructed to support a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate; and an optical apparatus as described herein, configured to condition the radiation beam in the illumination system and/or the patterned radiation beam in the projection system.

According to an aspect, there is provided a device manufacturing method comprising projecting a patterned beam of radiation onto a substrate, wherein the patterned beam is formed from a radiation beam which is conditioned by an optical apparatus as described herein.

According to an aspect, there is provided an optical tilt sensor arranged to direct a beam of radiation along an optical axis to a reflective surface whose tilt is to be measured, wherein a source for the directed beam of radiation is located on the optical axis while a photodetector configured to detect the reflected radiation surrounds the optical axis so that the directed beam passes through the center of the photodetector.

The optical tilt sensor may be applied to measure the angular position (tilt) of an actuator as described herein, in at least two dimensions. The optical tilt sensor may be applied to many other applications as well.

In an embodiment, the photodetector comprises a plurality of photosensitive elements spaced around the optical axis, the sensor further comprising a signal processing arrangement configured to derive a varying two-dimensional tilt measurement in response to movement of the reflected radiation over the photosensitive elements. The photodetector may, for example, comprise four quadrant-shaped photovoltaic cells having a central aperture for passage of the directed beam of radiation.

The directed beam of radiation in some embodiments has an annular intensity profile that is dark around the optical axis, such that reflected radiation is not directed back to the source. This allows the use of a semiconductor laser, for example a vertical cavity surface-emitting laser (VCSEL), as the radiation source, without radiation being reflected back into the laser from the reflective surface.

The reflective surface may be curved so as to achieve a desired trade-off between range and resolution.

In accordance with an aspect, that may be used independently of the particular actuator and/or tilt sensor described herein, a plurality of movable field facet mirrors are provided in a faceted field mirror device within a fly's eye illuminator. Each movable field facet mirror is controllable to direct a portion of the beam to a selected one of several associated pupil facet mirrors in a faceted pupil mirror device, and the several pupil facet mirrors are of different sizes, according to their position in the pupil mirror device.

By this measure, larger ones of the associated pupil facet mirrors are located where the accuracy of focusing the image is lower, relaxing design constraints.

An example application of embodiments of the invention is in conditioning of a radiation beam, for example in the field of lithography. An embodiment of the invention may be used to adjust the position or orientation of an optical component in an extreme ultraviolet (EUV) optical apparatus, such as may be used in lithography. Embodiments of the invention are not limited to such an application nor to such a particular wavelength range.

Further aspects, features, and potential advantages, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

The accompanying drawings, which are incorporated herein and form part of the specification, illustrate the present invention and, together with the description, further serve to explain the principles of the invention and to enable a person skilled in the relevant art(s) to make and use the invention. Embodiments of the invention are described, by way of example only, with reference to the accompanying drawings, in which.

DETAILED DESCRIPTION

Embodiments of the present invention concern an actuation mechanism that may be deployed in a wide range of applications. In an example application, actuation mechanisms may be provided to move various components within a lithographic apparatus. The components may be optical components, and may for example be EUV optical components. Actuators deployed within such apparatus may have to meet stringent environmental and performance criteria. For example, it may be desirable to avoid friction between parts to avoid the need for lubricants and/or to avoid generating wear particles. An EUV apparatus typically includes a near-vacuum environment, so that an outgassing material such as a lubricant may not be tolerated. Low heat dissipation may be a consideration. There will be described below a novel type of actuation mechanism that can help meet one or more of these stringent criteria. Before describing the actuator, some examples of EUV lithographic apparatus will be introduced. Further below, an example of how the actuator may be deployed will be described. It will be understood, however, that embodiments of the invention of the actuator are widely applicable and not at all limited to use in lithographic apparatus in general, or EUV lithographic apparatus in particular.

Figure 1:
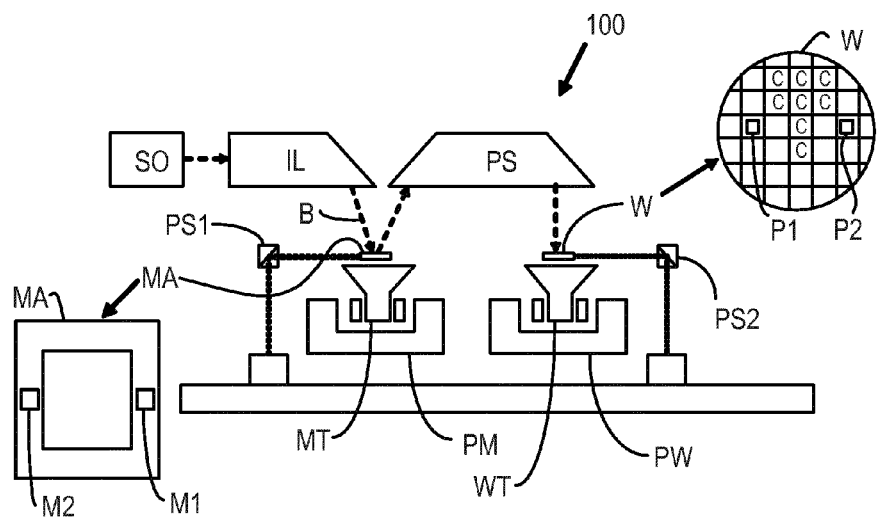
FIG. 1 depicts schematically a lithographic apparatus having reflective optics according to embodiments of the invention.

FIG. 1 schematically depicts a lithographic apparatus 100 including a source collector module SO according to an embodiment of the invention. The apparatus comprises: an illumination system (illuminator) IL configured to condition a radiation beam B (e.g. EUV radiation); a support structure (e.g. a mask table) MT constructed to support a patterning device (e.g. a mask or a reticle) MA and connected to a first positioner PM configured to accurately position the patterning device; a substrate table (e.g. a wafer table) WT constructed to hold a substrate (e.g. a resist-coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desirable to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g. employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the desired plasma can be produced by irradiating a fuel, such as a droplet, stream or cluster of material having the required line-emitting element, with a laser beam. The source collector module SO may be part of an EUV radiation system including a laser, not shown in FIG. 1, for providing the laser beam exciting the fuel. The resulting plasma emits output radiation, e.g., EUV radiation, which is collected using a radiation collector, disposed in the source collector module. The laser and the source collector module may be separate entities, for example when a $CO_2$ laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as faceted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using mask alignment marks M1, M2 and substrate alignment marks P1, P2.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
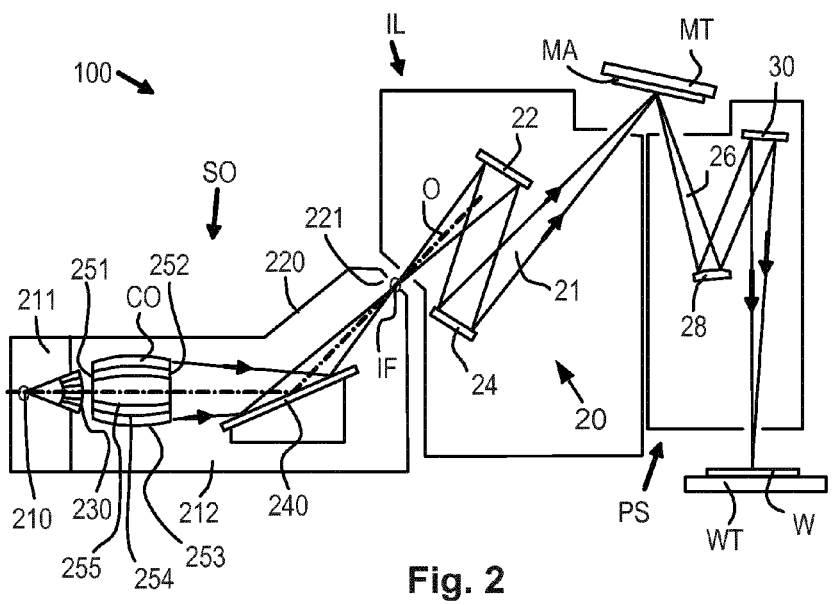
FIG. 2 is a more detailed view of the apparatus of FIG. 1.

FIG. 2 shows the apparatus 100 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be needed for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap), which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein may at least include a channel structure, as known in the art.

The collector chamber 212 may include a radiation collector CO which may be a so-called grazing incidence collector. Radiation collector CO has an upstream radiation collector side 251 and a downstream radiation collector side 252. Radiation that traverses collector CO can be reflected off a grating spectral purity filter 240 to be focused in a virtual source point IF. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a faceted field mirror device 22 and a faceted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the Figures, for example there may be 1-6 additional reflective elements present in the projection system PS than shown in FIG. 2.

Collector optic CO, as illustrated in FIG. 2, is depicted as a nested collector with grazing incidence reflectors 253, 254 and 255, just as an example of a collector (or collector mirror). The grazing incidence reflectors 253, 254 and 255 are disposed axially symmetric around an optical axis O and a collector optic CO of this type is desirably used in combination with a discharge produced plasma source, often called a DPP source.

Figure 3:
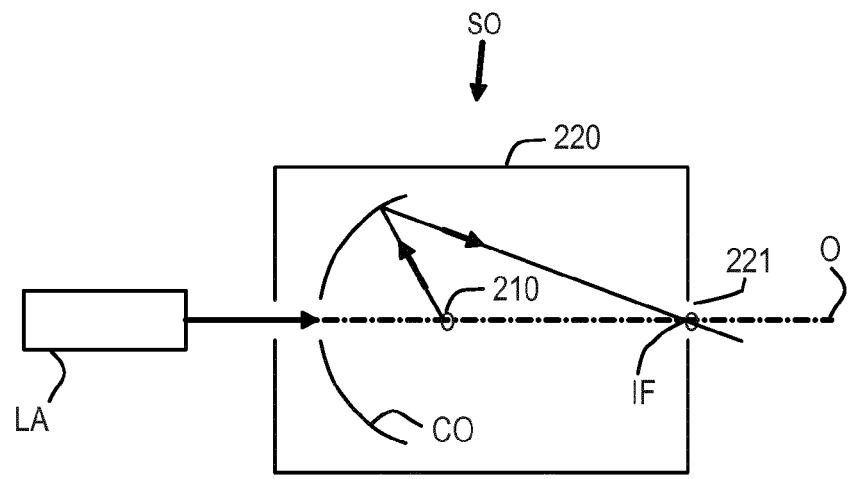
FIG. 3 is a more detailed view of an embodiment of a source collector module for the apparatus of FIGS. 1 and 2.

In an embodiment, the source collector module SO may be part of an LPP radiation system as shown in FIG. 3. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

Figure 4:
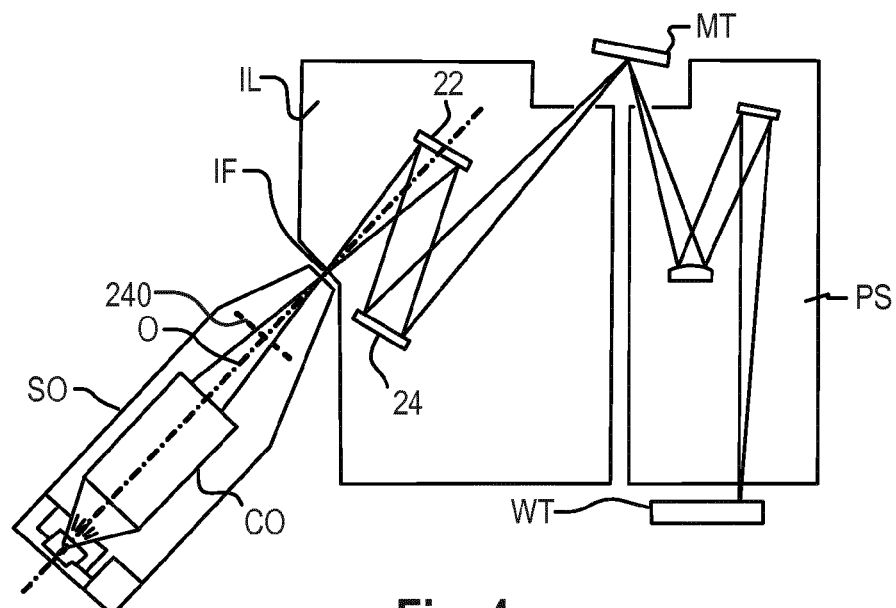
FIG. 4 depicts an EUV lithographic apparatus according to embodiments of the invention.

FIG. 4 shows an alternative arrangement for an EUV lithographic apparatus in which the spectral purity filter 240 is of a transmissive type, rather than a reflective grating. The radiation from source collector module SO in this case follows a straight path from the collector optic to the intermediate focus IF (virtual source point). Note that positioning the filter close to or at the IF will lead to very high absorbed power densities. The high temperatures that result may degrade the filter. On the other hand, the filter area can be small, which is an advantage. In alternative embodiments, not shown, the spectral purity filter 240 may be positioned at the virtual source point IF or at any point between the collector optic CO and the virtual source point IF. The filter can be placed at other locations in the radiation path, for example downstream of the virtual source point IF. Multiple filters can be deployed. As in the previous examples, the collector optic CO may be of the grazing incidence type (FIG. 2) or of the direct reflector type (FIG. 3). The spectral purity filter may be designed to suppress unwanted radiation in the infrared wave band, leaving DUV radiation to be suppressed by other means.

The following description presents optical apparatus and methods that can condition a radiation beam being directed at a target location on an object. The object can be, for example, a lithographic patterning device MA for generating a circuit pattern to be formed on an individual layer in an integrated circuit, or a substrate W on a substrate table WT of a lithographic apparatus. The target location may be an area of the patterning device MA illuminated by the illumination system IL. Example patterning devices include a mask, a reticle, or a dynamic patterning device. The reticles can also be for use within any lithography process, while the emphasis in this application will be on EUV lithography. Within the illumination system, actuators are used to move reflective elements so as to select different illumination modes.

Figure 5:
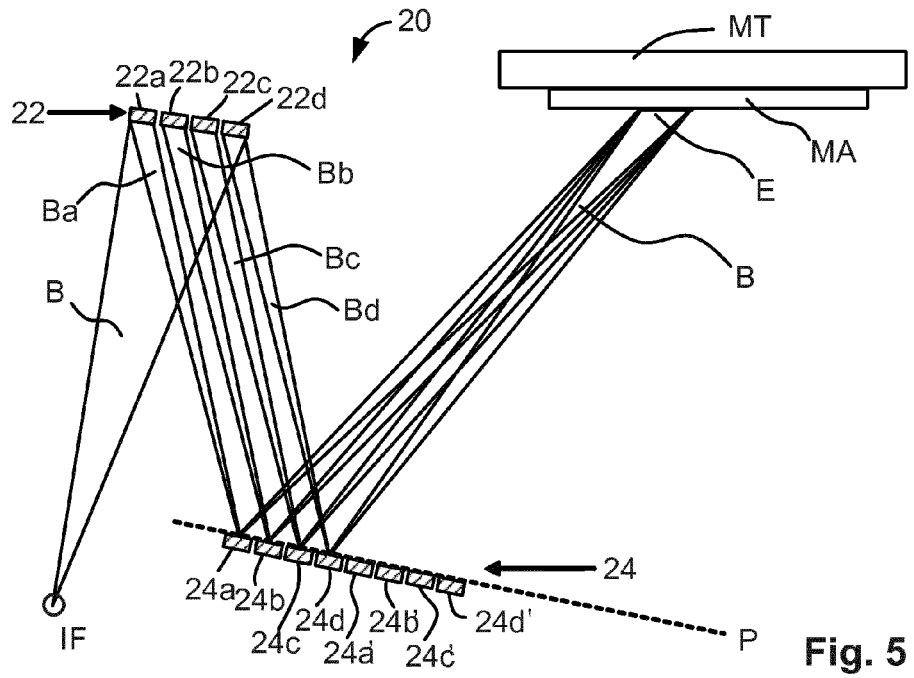
FIG. 5 is a first cross sectional view of part of an illumination system of a lithographic apparatus in which an actuation mechanism according to an embodiment of the invention may be used.

FIG. 5 schematically shows a cross sectional view of an exemplary optical apparatus 20 to condition a radiation beam in the illumination system IL of a lithographic apparatus of the type shown in FIGS. 1 to 4. Apparatus 20 includes a first reflective component 22 in the form of a faceted field mirror device 22 and a second reflective component 24 in the form of a faceted pupil mirror device 24. Faceted field mirror device 22 comprises a plurality of primary reflective elements, some particular ones schematically indicated in FIG. 5 and referred to as field facet mirrors 22a, 22b, 22c and 22d. The second reflective component 24 comprises a plurality of secondary reflective elements including, for example, the particular secondary reflective elements referred to as pupil facet mirrors 24a, 24b, 24c, 24d, and 24a', 24b', 24c', 24d'.

Generally, the field facet mirrors 22a-d direct respective parts of incoming radiation beam B towards the pupil facet mirrors 24a-d, 24a'-d'. Although only four field facet mirrors 22a-d are shown, any number of field facet mirrors may be provided. The field facet mirrors may be arranged in a generally two-dimensional array, which does not mean that they should lie strictly in a flat plane. Although only eight pupil facet mirrors 24a-d, 24a'-d' are shown, any number of pupil facet mirrors may be provided, the number being typically a multiple of the number of field facet mirrors. The pupil facet mirrors may be arranged in a two-dimensional array. The shapes and configurations of the field facet mirrors and pupil facet mirrors may be square, rectangular, circular, or more complicated in shape, according to design.

Each field facet mirror 22a-d reflects a portion of the radiation beam B received by the first reflective component (22) in the form of a sub-beam of radiation towards a different pupil facet mirror 24a-d of the pupil mirror device 24. For example, a first sub-beam Ba is directed by a first field facet mirror 22a to a first pupil facet mirror 24a. Second, third and fourth sub-beams Bb, Bc and Bd are directed by second, third and fourth field facet mirrors 22b, 22c, and 22d respectively to second, third and fourth pupil facet mirrors 24b, 24c, and 24d. The spatial intensity distribution of the radiation beam B at the pupil mirror device 24 can define an illumination mode of the lithographic apparatus. In one embodiment, the field facet mirrors 22a-d have adjustable orientations and may be used with different ones of the pupil facet mirrors 24a-d, 24a'-d', to form different spatial intensity distributions at the pupil plane P, thereby providing different illumination modes. This arrangement will be described later with reference to FIG. 6. The pupil facet mirrors 24a-d may be adjustable in orientation.

Each of the field facet mirrors 22a-d is shaped so as to form an image of the intermediate focus IF at a different pupil facet mirror 24a-d, of the pupil mirror device 24. In practice, the intermediate focus IF will be a virtual image of the plasma source, the image having a finite diameter (e.g. 4-6 mm). Consequently, each field facet mirror 22a-d will form an image of the virtual source point IF, which has a finite diameter (e.g. 3-5 mm) at the pupil facet mirrors 24a-d. The pupil facet mirrors 24a-d, may each have a diameter that is larger than the aforementioned image diameter (to avoid radiation falling between pupil facet mirrors and thereby being lost). The intermediate focus IF and images of the intermediate focus IF are shown as points in the figures for ease of illustration only.

The faceted mirror devices 22 and 24 together form a so-called "fly's eye" illuminator, by which non-uniformities present in the radiation source are eliminated to illuminate area E with more even distribution, and with more control. Each one of the pupil facet mirrors 24a-d may form an image of its associated field facet mirror 22a-d at or near the field plane wherein the patterning device MA is located during exposure of a substrate. These images are substantially overlapping and together form an illumination area E. As a result, a spatially non-uniform intensity distribution in a cross section of the radiation B as emanating from the source SO and received by the optical apparatus 20 is conditioned to have a substantially spatially uniform intensity distribution in the illumination area E. The shape of the illumination area E is determined by the shape of the field facet mirrors 22a-d. In a scanning lithographic apparatus, the illumination area E may for example be a rectangle or a curved band, when viewed in two dimensions which in the scanning direction has a width narrower than the width in a direction perpendicular to the scanning direction.

A wavelength of the desired part of radiation may be an EUV wavelength in the range 5-20 nm, for example 13.5 nm. The beam B may also include large amounts of unwanted radiation, for example at DUV wavelengths. Other patent publications disclose techniques for reducing the transmission of unwanted radiation through the illuminator.

Figure 6:
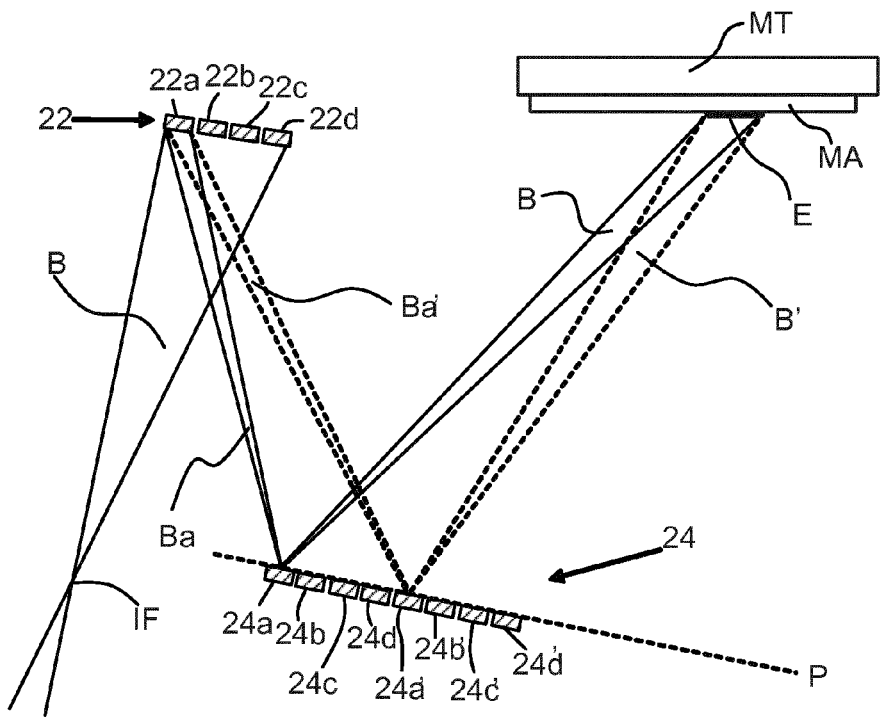
FIG. 6 is a second cross sectional view of the apparatus of FIG. 5 showing adjustment of a field facet mirror to address two associated pupil facet mirrors.

As mentioned already, each field facet mirror 22a-d of field mirror device 22 may have more than one associated pupil facet mirror of pupil mirror device 24. A field facet mirror of field mirror device 22 can be controlled to cooperate with different ones of its associated pupil facet mirrors at different times. For example, as shown in FIG. 6, field facet mirror 22a has two associated pupil facet mirrors 24a and 24a'. These are used in different illumination modes of illuminator 20 (the illuminator being an example of an optical apparatus 20). Field facet mirror 22a may thus be controlled in a second mode to direction EUV radiation towards pupil facet mirror 24a' instead of 24a, while radiation with an undesired wavelength, such as DUV radiation may be scattered to fall onto neighboring pupil facet mirrors like 24c, 24d, 24b' or 24c'.

A novel 2-D motor part for an actuator according to embodiments of the invention will be described hereafter. This motor can be applied in actuators to drive the field facet mirrors or other movable elements in, for example, an EUV system. The same principles of motor and actuator can be applied in other optical applications and in other applications generally. It has generally been sufficient to provide two operating positions, for example, to effect the two illumination modes illustrated in FIG. 6. To provide a greater number of illumination modes, without sacrificing unduly the available radiation, actuators with more than two positions are desired. By providing an actuator with two rotational degrees of freedom, a far greater number of positions can be addressed, thereby resulting in more useful illumination settings.

In PCT patent application publication no. WO 2011/000671 A1, for example, bimetallic strips are used to apply actuating forces directly to an actuator rod. Another example might be piezoelectric motors. These types of motor mechanism may have some problematic implementation characteristics. For instance a bimetallic motor may be slow (or may generate too much heat), the piezoelectric motor may be complex and may need a complex driving power amplifier. The principle of magnetic actuation is attractive, because magnetic coupling can be applied from outside the vacuum environment associated with an EUV system. The magnetic coupling can provide thermal isolation. Examples of actuators using magnetic coupling will be described in more detail below.

Figure 7:
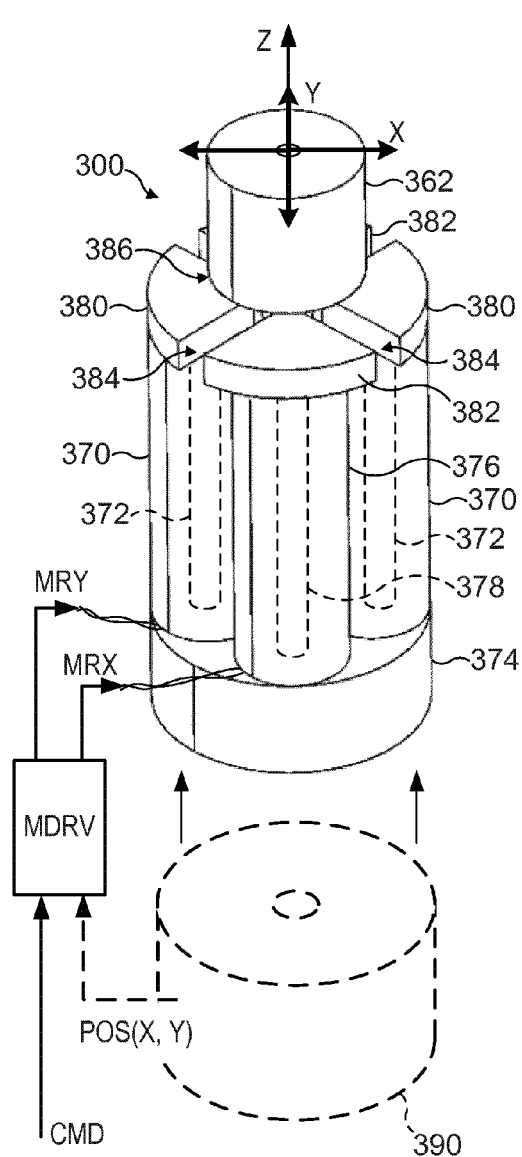
FIG. 7 illustrates the basic form of a novel 2-D planar motor for use in actuation mechanisms according to embodiments of the present invention, with control functions indicated schematically.

FIG. 7 shows the main elements of a motor 300 to provide controllable forces and displacement in at least two-dimensions. A primary moving part comprises permanent magnet 362. The magnet is attached to a moving part of the suspension (not shown in FIG. 7). The moving part including magnet 362 is coupled to a fixed part of the suspension arrangement such that the magnet is free to move in both the x and y directions, as indicated. The suspension arrangement may be such as to bias the moving part toward the central position indicated when the motor is not energized. At the same time, the magnet is constrained to move in the z direction. In the example of an actuator to tilt a mirror in an optical apparatus, the z constraint is provided in the form of a pivot or virtual pivot. Examples of such suspension will be illustrated further below. For the present description, it is sufficient to note that displacement dx of magnet 362 translates into a desired tilting motion dRy of the moving part of the actuator. Similarly a displacement dy into the page is sufficient to effect a tilt dRx about the X axis about the same pivot point. The pivot points need not be coincident, though they are in this example. Assuming that the distance to the pivot point is much greater than the range of movement of the magnet, the magnet can be considered to be moving substantially over an area within a plane.

To effect movement of the moving part in a controllable manner, a static portion of the 2-D motor 300 comprises at least two bipolar electromagnets. A first bipolar electromagnet is formed by coils 370 on ferromagnetic cores 372 (inside the coils, shown in broken likes). Proximal ends of cores 372 are connected to one another via a ferromagnetic core base 374. A second bipolar electromagnet is formed by a second pair of coils 376 arranged orthogonally to the coils 370, on ferromagnetic cores 378. Only one of the coils 376 is visible in FIG. 7, with the other one being behind. Proximal ends of cores 378 are connected to one another via the same ferromagnetic core base 374. In an embodiment, the cores of each electromagnet may be connected together, but not connected to the cores of the other electromagnet.

Distal ends of cores 372 are positioned close to the moving magnet 362, spaced in the X direction either side of a central Z axis. In this example, the cores 372 are provided at their distal ends with ferromagnetic pole shoes 380. Similarly, cores 378 are provided at their distal ends with pole shoes 382. Each pole shoe provides a pole face that is generally flat and substantially fills a sector of, for example, a circle around the axis; the pole shoes may form a different shape than a circle. In this example, the circle filled by the pole faces extends to a radius equal or greater than the maximum desired excursion of the moving magnet 362. Gaps 384, etc. are used between the adjacent pole shoes so that the pole shoes are not connected pieces of ferromagnetic material. The gaps may be filled with non-magnetic spacer material to help prevent the pole shoes from touching. The aim of the design is to fill the circle as completely as possible, and each gap may be less than 10%, optionally 5% of the circle diameter. As there are four core ends with pole shoes, the sectors in this example are quadrants. In principle, a different number of electromagnets and pole shoes may be provided, but four is sufficient to provide two dimensional actuation, as will be explained in further detail below.

The circle defined by the pole faces may further be provided with an opening at its center, so that each face is a sector of an annulus, rather than a complete circle. The opening is to provide access for an optical position sensor, and should be only as large as necessary for this purpose, to avoid reducing the motor's force. In the examples illustrated, the radius of the central opening is less than 25%, optionally less than 20% or 15% of the radius of the circle.

For improved efficiency of the motor, the gap 386 in the longitudinal (z) direction between magnet 362 and pole shoes 380, 382 is made small relative to the width (e.g. diameter) of the side of the magnet that is facing the pole shoes. This side, which may be referred to as the magnetic face of magnet 362 may be, for example, between 5 mm or 7 mm and 10 mm in width, while the gap is between 0.5 and 1.5 mm. The gap may thus be less than 20%, less than 15% or even less than 10% of the width of the magnet face. Practical considerations may restrict how small the gap can be made, however. For example, an advantage of this type of motor may be that the electromagnets and moving magnet can be in different atmospheric compartments, separated from one another by a barrier. This will be illustrated in the examples that follow. The gap in such a case should allow for the thickness of the barrier.

In a case where the pole faces of the electromagnets lie in a plane, the magnet 362 swinging about its pivot point away from the central position will move slightly away from the pole faces, increasing the gap 386. In other words, the magnet swings through a curved surface, not strictly a flat plane. Assuming that the range of movement dx, dy of the magnet is many times smaller than the distance to its pivot point, then this increase in the gap may be insignificant. The curved surface can be treated as a plane for practical purposes. The gap 386 is thus defined between a first plane in which the magnet's lower face moves, and a second plane in which lie the pole faces (defined as the surfaces of the pole shoes 380, 382 that face the moving magnet).

However, in a case where the angle of tilt is substantial, and/or the gap 386 at the central position is particularly small, the gap may increase more significantly as the magnet moves toward its extreme positions. To counteract this effect, the faces of the pole shoes can be shaped or angled so as to define a surface that is not perfectly flat, but rather dished. In that case, the gap between the magnet and the pole faces, and hence the strength of magnetic coupling can be made fairly constant even with large tilt angles, and the motor force can be maintained across the operating range of the motor.

Needless to say, an embodiment with the pole faces lying in a plane may be easier to manufacture. This is particularly a consideration when a large number of actuators are to be arrayed together, as in the examples illustrated below.

Electric currents can be passed through coils 370 to energize the first electromagnet and attract the moving magnet away from its central position illustrated, in either a positive or negative direction along the X axis. For example, if the magnet 362 is oriented with its north pole facing the pole faces, it will be attracted to move over whichever pole face becomes a south pole as a result of the applied current. By controlling the polarity (direction) of the current, one can control the direction of the force applied to the moving magnet. By controlling the magnitude of the current, one can control the magnitude of the force. Thus it is possible to use coils 370 achieve a displacement dx and hence rotation (tilt) dRy of the actuator moving part to which the magnet 362 is attached. In a similar way, the coils 376 can be used to impart a displacement dy to the magnet 362, and hence effect a tilt dRx of the actuator moving part about the X axis. The coils 370 can be energized in unison by connecting them electrically in series. Independent driving of the coils, and different arrangements of coils, are of course possible. Drive circuitry MDRV is provided to generate drive signals (currents) MRY for the coils 370 and MRX for the coils 376 in response to command signals CMD received from a controller (not shown).

Since the drive signals MRY and MRX can be applied to energize the coils 370 and 376 simultaneously, and since the strength of each signal can be controlled, it is in principle possible to apply a force of a desired strength in any direction around the axis. Furthermore, by proper design and placement of the pole faces and the magnet 362, the position may be controllable in X and Y directions quite independently. While known actuators may define two or three operating positions very precisely with end stops, this is impractical when a larger number of operating positions are desired. In principle, the force and resulting displacement are correlated with the drive currents of the coils. However, this correlation is not well-enough defined and constant enough to be relied upon under all operating conditions. For instance, temperature fluctuations may affect the strength of magnet 362 and thereby the tilts. Consequently, a feedback control loop may be implemented, using a position signal POS, illustrated by the dotted input in FIG. 7. This position signal may be obtained for example by an optical sensor which reflects one or more beams of radiation from reflective surfaces somewhere on the moving part within the actuator. In the embodiment illustrated, an optical position sensor 390 can be fitted at the back side of the pole base 374. Pole base 374 and pole shoes 380, 382 provide apertures around the axis of the motor, through which sensor 390 can 'see' the base of the moving magnet 362. Various optical techniques can be used to obtain a two-dimensional value for the position of the magnet.

Figure 8:
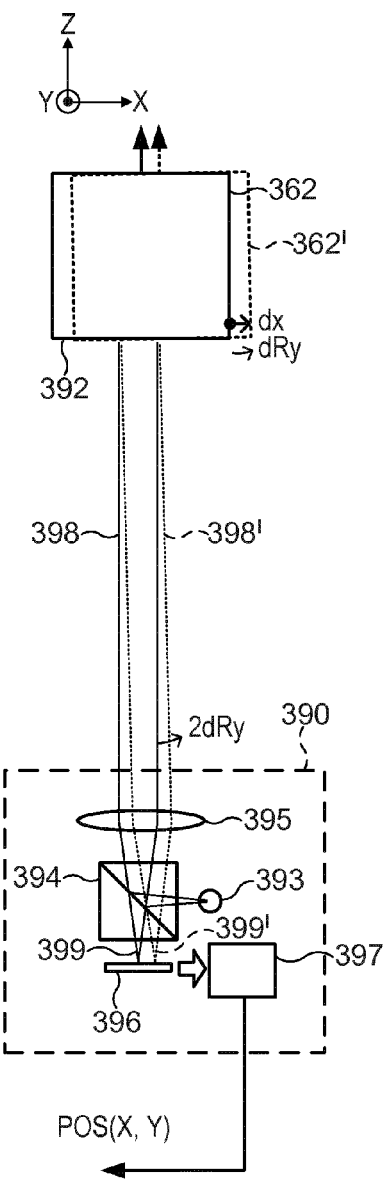
FIG. 8 illustrates the form and operation of an optical position sensor that may be used to implement the control functions of FIG. 7.

FIG. 8 illustrates a possible embodiment of an optical position sensor 390, based on an autocollimator design. The moving magnet 362 is illustrated at the top of the diagram, and has a reflective surface 392 (mirror) on its side facing the sensor. The coils and cores are omitted for clarity. Sensor 390 comprises a point radiation outlet 393 (connected or connectable to or comprising a radiation source such as a laser or LED), a beam splitter 394, a focusing optic 395, a multi-element photodetector 396 and processing unit 397.

In operation, focusing optic 395 forms an image 399 of radiation output 393 on the surface of photodetector 396, using a beam 398 of radiation reflected from a mirror surface 392 on the moving magnet 362. Photodetector 396 can detect the position of the image. The photodetector may be a 2-D pixel array of a resolution appropriate to the resolution positional information. Also a PSD (position sensitive device) can be used, which provides the position of the center of gravity of the radiation spot falling on the PSD. The elements of sensor 390 are aligned so that the image 399 is at least approximately centrally positioned on photodetector 396, when the magnet 362 is at its central position. When a displacement dx is applied to move the magnet to position 362', shown dotted, the magnet 362 also tilts through angle dRy as described already. Beam 398 is thus reflected with an angular deviation to follow the path 398'. The deviation of the beam causes a displaced image 399' to be formed somewhere away from the center of detector. If the magnet tilts in two dimensions, the image 399' will be displaced in two dimensions.

Processing unit 397 receives signals from detector 396 and calculates the co-ordinates of the image position, for example in x and y co-ordinates. These can be used as an indication of the angular displacements dRy and dRx of the moving magnet 362, and hence the current angular position of the actuator. A position signal POS(X,Y) is thus made available to allow motor drive unit to implement servo control of the motor to achieve and maintain any position commanded by signal CMD. Moreover, to the extent that the motor design achieves independent actuation in the x and y directions by the respective drive signals MRY, MRX, control loops for X and Y can be implemented independently in a simple manner. The functions of processing unit 397 can be implemented in common processing hardware with other processing functions including the servo control, if desired.

In a case where mirror surface 392 is flat, the angular deviation of beam 398 will be twice the angular displacement of the magnet 362. For example, deviation 2dRy is marked on the diagram, for a mirror displacement angle Ry. The mirror surface need not be flat, however, and can be deliberately curved to achieve a desired combination of sensitivity and compactness in the position sensor. In particular, one can make the mirror surface spherical and convex such that the reflection angle reduces to a value less than 2dRy. The radius of curvature of the convex mirror in fact determines the proportionality constant between dRx,y of the moving magnet and the displacement dx,y of the radiation spot on the detector 396. Thus a more convex shape leads to smaller excursions of the spot and enables a smaller opening between the four coils, and especially a smaller aperture in the pole base 374. A penalty for this is potentially a lower resolution in the position measurement, but this lower resolution may be acceptable.

Note that an optical sensor is mentioned only as one option, and various types of optical sensors, encoders and the like may be envisaged, as well as sensors based on magnetism, for example.

Figure 9:
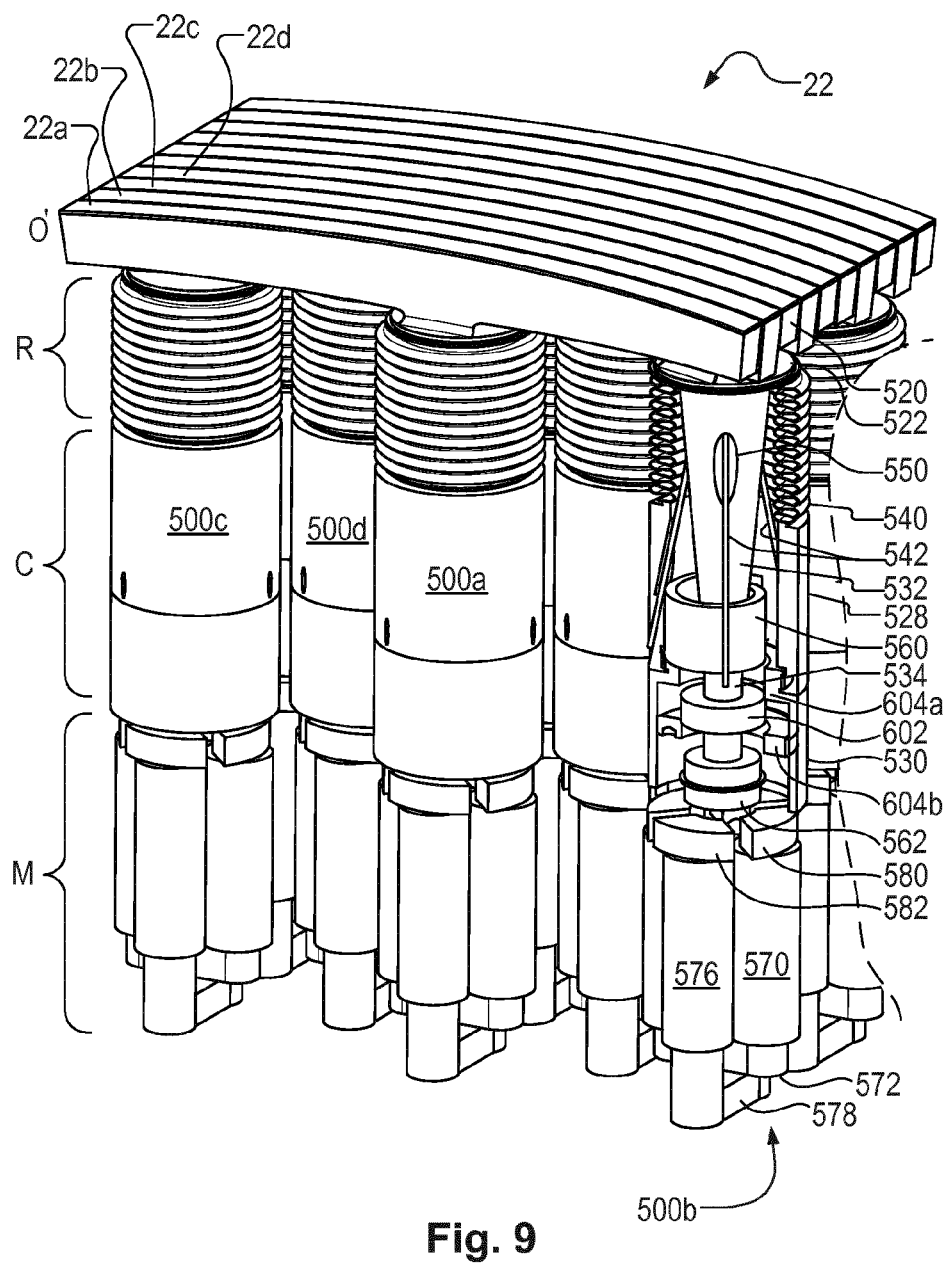
FIG. 9 is an external and partially cut away view of a field facet mirror module in a lithographic apparatus, the field facet mirror module including a number of actuation mechanisms according to an embodiment of the present invention.
Figure 10:
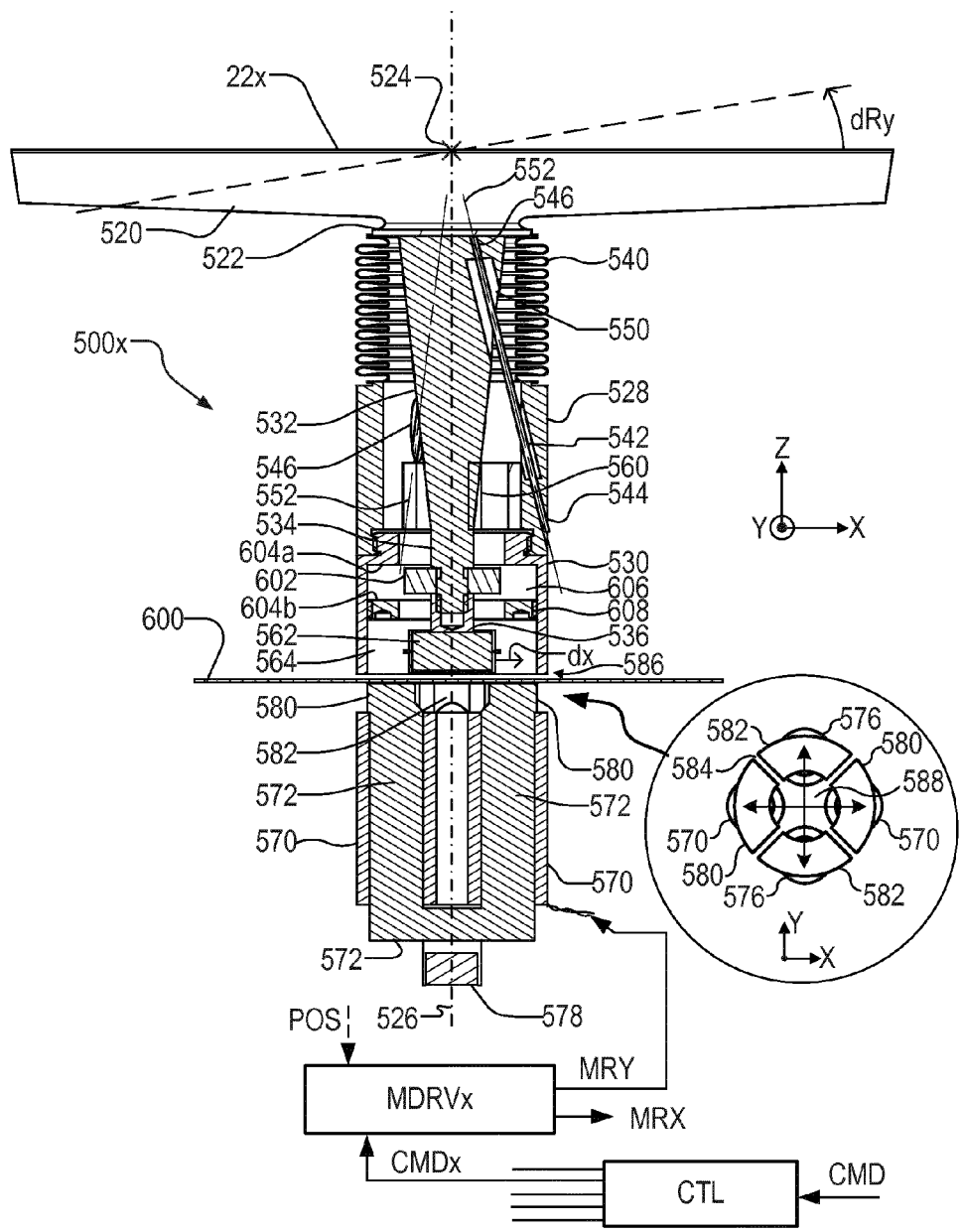
FIG. 10 is a cross sectional view of one actuation mechanism in the mirror module of FIG. 9.

FIGS. 9 and 10 illustrate a practical embodiment in which several actuators including motors of the general type shown in FIG. 7 are applied to effect movement of reflecting elements serving as field facet mirrors 22a to 22d, etc. in the illumination system of an EUV apparatus such as the ones described above. FIG. 9 illustrates a perspective view of a faceted field mirror sub-assembly having ten moveable elements 22a, etc., each mounted on an individual actuator 500a-d, etc. The actuator 500b connected to element 22b is shown cut away, with individual parts labeled. FIG. 10 illustrates a generic element 22x mounted on the head of an actuator 500x. The same reference signs are used for the parts of the actuator and the reflective element in both FIGS. 9 and 10, and both Figures can be referred to when reading the following description. For ease of interpretation, the reflective surfaces are shown facing upward in the diagram. As is seen in FIGS. 1 to 6, the faceted field mirror 22 and its reflective elements in fact may face generally downwards towards the ground. This need not be the case in other apparatus, for lithography or other purposes. References to up and down directions, and terms such as "above" and "below" in the description of FIGS. 9 and 10 refer to the orientation as seen in the drawings, and do not imply any particular orientation when the apparatus is installed in its operating environment.

At the left hand side in FIG. 9, portions of the sub-assembly are broadly identified as corresponding to the motor M, chassis C, suspension R and the actuated object itself, O'. While particular forms of these elements are illustrated in this example, each of them may be substituted for different forms. Some example variations will be described below, while the number of variations available is practically infinite.

In the example illustrated, the object to be moved comprises a body 520 on which the reflective element 22x is formed. As can be seen, each reflective element comprises an elongated, curved, near-planar surface. The actuator 500x has a head 522 on which body 520 is mounted. In this example, the body and actuator provide two rotational degrees of freedom centered on a virtual pivot point 524. A first degree of freedom is rotation about a Y axis pointing into the page in FIG. 10. Displacement in this degree of freedom is indicated by the tilt angle dRy. It will be understood that the tilt angle here is shown highly exaggerated. The second degree of freedom is rotation about an X axis, also through the virtual pivot point 524, the X axis running across the page in FIG. 10.

Actuator 500x may be generally elongated (e.g. cylindrical) in form, allowing it to cluster side by side with similar actuators for the other reflecting elements in the subassembly. An axis 526, vertical in the diagrams, extends in the Z direction. A chassis part of the actuator is formed by cylindrical casing formed in upper and lower sections 528 and 530. Actuator head 522 is fixed to an actuating rod, here shown with an upper portion 532 which tapers in a downward direction to intermediate portion 534 and lower portion 536. In the example, portions 532 and 534 are machined from a single piece of metal, while portion 536 is attached to portion 534 by a screw thread. Such details may be a matter of design choice. The actuator head and rod are supported on upper casing 528 by a combination of bellows section 540 and three tendons, all labeled 542. Each tendon 542 is fixed at a first end 544 into the wall of casing section 528 and at a second end into actuator rod 532, just below the head 522, and run along a respective axis 552. Tendons 542 also pass through apertures 546 and 550 formed in those parts, as shown. For compatibility with the vacuum environment within EUV lithography apparatus, bellows section 540 may for example be made of corrugated metal.

It will be appreciated that the wall thickness and corrugation of the bellows section is thin enough to permit the two dimensional tilting motions dRx and dRy that are desired to adjust the angle of mirror 22x. With regard to other degrees of freedom, tendons 542 effectively form a tripod which constrains the head against translation of desired virtual pivot point 524 in X, Y, and Z directions, while bellows 540 constrains rotation Rz. "Constraining" in this context means providing a very high degree of stiffness against the relevant degree of freedom, sufficient to act effectively as a rigid mounting. The deviation from perfect rigid mounting translates to some parasitic movement when the actuator rod is moved by a motive force to achieve the desired operations of the actuator 500x.

Within upper casing section 528 and surrounding the actuator rod, a flexible link 560 provides a thermal connection between actuator rod part 532 (and via this the mirror body 520) to the casing. Casing section 528 may be mounted in a liquid (e.g., water) cooled base plate, not shown in the drawings. The thermal link may be for example a so-called Litz wire, comprising a bundle of fine copper wires. Instead of a Litz wire, alternative flexible thermal links might be used, like flexible heat pipes. The thermal link introduces further parasitic stiffness, though it may be small in comparison with that of the mounting. The Litz wire may also introduce some hysteresis, which the servo control should take care of.

At the lower end of the actuator rod, rod portion 536 carries a permanent magnet 562, which forms a moving part of a motor function. Bottom section 530 of the casing provides a chamber 564 in which magnet 562 is free to move in both the x and y directions. Thanks to the constraints defining the virtual pivot point 524, displacement dx of magnet 562 translates into the desired tilting motion dRy. Similarly a displacement dy into the page (FIG. 10) is sufficient to effect a tilt dRx about the X axis about the same pivot point 524. To effect this movement in a controllable manner, and specifically to provide actuating forces against the centering force imparted by bellows section 540 and tripod tendons 542, a static portion of the actuator comprises a bipolar electromagnet formed by coils 570 on ferromagnetic core 572. Coils 570 and core 572 are formed in a U shape, and can be energized to provide actuating forces in both positive and negative directions along the X axis to achieve displacement dx and hence rotation (tilt) dRy. The coils though shown as a pair can be energized in unison by connecting them in series. Independent driving of the coils, and different arrangements of coils, are of course possible.

A top view of the core 572 and coils 570 is provided in an inset detail in FIG. 10. As can be seen, a second bipolar electromagnet is formed by a second pair of coils 576 is arranged orthogonally to the coils 570, on a U-shaped core 578. Each electromagnet is provided with pole shoes 580, 582 whose pole faces each fill a quadrant of the circle over which magnet 562 may move. Energizing these coils can be used to impart a displacement dy to the magnet 562, and hence effect a tilt dRx of mirror 22x about the X axis. Drive circuitry MDRVx is provided to generate drive signals MRX, MRY for the coils to achieve desired positioning of magnet 562, in response to command signals CMDx received from a controller CTL.

It will be seen from the above that each actuator 500x comprises a motor of the general type shown as 300 in FIG. 7. Motor parts 562, etc. are labeled consistently with the parts 362, etc. of the motor 300. One difference in this example is that the motor in FIGS. 9 and 10 has separate U-shaped cores 572, 578 for the first and second electromagnets. The example in FIG. 7 has a common ferromagnetic base 374 for both electromagnets. Also, the example in FIG. 7 is illustrated with a larger aperture at the center of the pole faces than may be provided in practice (as compared to the center aperture 588 in FIG. 10).

Controller CTL, for example, may generate command signals for all similar drive circuits in all the actuators of the faceted field mirror or the sub-assembly. Controller CTL can be programmed for example to receive a higher level command CMD, which may indicate a particular desired illumination mode, and to infer the individual positions needed for each field facet mirror. In the example illustrated, a magnetic coupling is used between the actuator rod magnet 562 and the energizing part of the motor formed by coils 570, 576, to allow environmental isolation between different parts of the mechanism. A barrier in the form of non-ferromagnetic membrane 600 provides this isolation in the illustrated embodiment. Membrane 600 is shown in FIG. 10 but omitted in FIG. 9 for clarity. Membrane 600 can extend continuously across several neighboring actuators, simplifying the construction of a multi-actuator array of the type shown in FIG. 9. The membrane may be of thin stainless steel for example. Glass may be used when an optical position sensor of the type shown in FIG. 8 is used. The drive circuitry and electromagnets can thus be placed outside the vacuum environment, or in a sub-environment, distinct from the sensitive environment within the illumination system of an apparatus such as an EUV apparatus. This environmental isolation may relax design constraints and choice of materials on the motor components. It may improve access for maintenance.

The coils 570, when energized, constitute a source of heat, and the choice of magnetic coupling to the actuator rod also provides a useful degree of thermal isolation. The entire actuator assembly should be compact to allow enough individual actuators to be mounted in the available space. The casing inner width (e.g., diameter) may be for example 16 mm and the outer width (e.g., diameter) of magnet 562 may be for example 10 mm, allowing a range of movement dx, dy=+/−3 mm.

As explained above, the detailed implementation of actuators of the type illustrated here may involve a compromise between robustness of the mounting, reflected in stiffness of the bellows section 540 and tripod (tendons 542), and the actuation force available through the motor (here the coils and magnet 562). In PCT patent application publication no. WO 2011/000671 A1, a two-position actuator has a relatively low stiffness in the movement direction, and a much higher stiffness in an orthogonal direction. This resolves the compromise satisfactorily. In the case of the present two-axis, multi-position actuator, however, the resilient mounting should have more or less equal stiffness in both directions. Consequently, the compromise between robustness of the support and ease of displacement becomes much more difficult to achieve, particularly with the limited space and heat dissipation requirements.

In order to reduce the motive force needed, and hence to avoid problems of increased size and heat dissipation in the electromagnets or other motor function, a stiffness compensation technique may be applied in the present example, as will now be explained. As explained more fully in U.S. provisional patent application No. 61/713,930 incorporated herein in its entirety by reference, a magnetic coupling is established between a magnet 602 mounted at the interface between actuator rod sections 532 and 536, and fixed elements 604a and 604b. Elements 604a, 604b are positioned above and below a cavity 606 in which magnet 602 can move with the rod. These parts and the cavity they form are (circularly) symmetric with respect to the axis 526, so that magnet 602 is in the form of a ring, for example with north-pole uppermost and south-pole lowermost. Elements 604a and 604b form upper and lower rings, defining the annular cavity 606.

With progressive displacement dx and/or dy, a greater portion of the magnet 602 will enter the space between the rings 604a and 604b. Its magnetic field lines will increasingly be coupled into the material of the rings 604a and 604b, via casing section 530. This provides an attractive force biasing the magnet 562 radially away from the axis 526, and hence biasing the rod and mirror 22x preferentially into tilted orientations. This magnetic counter-bias partially counteracts centering force provided by bellows section 540. By selection of suitable magnet 602 and by dimensioning the ring portions and cavity 606 appropriately, the relationship between the de-centering bias provided by magnetic coupling and the centering bias caused by the bellows section 540 and tripod (tendons 542), a desired relationship between displacements dx, dy and the energizing strength of the electromagnet coils 570 can be achieved. Without compromising the robustness of the resilient mounting, the actuating force needed to achieve desired positions of the facet mirror 22x can be reduced. In the embodiment illustrated, the lower magnetic coupling ring 604b can be adjusted up and down (z direction) inside casing section 530 by means of screw thread 608. This allows fine adjustment of the magnetic bias characteristic.

Numerous variations and modifications are possible without departing from the spirit and scope of the invention. Some of these have been mentioned already above. Others will be mentioned here, without intending to provide an exhaustive list. While the magnetic coupling in the illustrated examples is a de-centering bias, to counter a centering bias inherent in the resilient mounting of the object to be actuated, other applications and other embodiments may involve a resilient mounting biased in only one direction, with a magnetic counter bias in the opposite direction.

The desire for the particular combination of degrees of freedom and degrees of constraint in actuator 500x is a function of the particular optical system in which it is applied. Other embodiments of such optical systems, not to mention actuators and mountings for totally different applications, may suggest different freedoms and constraints. Even where the desired degrees of freedom and constraints are the same as illustrated here, numerous alternative mechanisms for providing a resilient mounting with the desired freedoms and constraints can be envisaged by the skilled reader. For example, alternative actuator designs disclosed in PCT patent application publication no. WO 2011/000671 rely on leaf springs formed by cutting out material from the casing of the actuator. Such a construction, as well as the bellows construction illustrated in the present application, has a merit of substantially no frictional contact between moving parts, reducing the risk of contaminant particles entering the operating environment.

In principle, the functions of motor magnet 562 and counter-bias magnet 602 could be combined in a single magnet or magnet system. It will be appreciated that lower casing section 530 may act as a shield to prevent interference between neighboring actuators and/or other components. Shielding could additionally or alternatively be provided by an arrangement of plates woven between the actuators (like an egg box). However, cross-talk between neighboring actuators may be greatly reduced by providing each with an individual shield of the type shown. There are thus effectively two shields between any pair of actuators. Moreover, the shield itself has a magnetic influence on the moving magnet 562, so that a symmetrical (cylindrical) shape may help achieve a uniform performance across the 2-D range of movement. In this regard, the casing section 530 acts as part of the magnetic counter-biasing arrangement discussed above.

Similarly a shield (not shown) can be provided around the electromagnets formed by coils and cores 570-578, or at least around the pole shoes. Further, thermal management measures can be deployed to remove excess heat from the electromagnets.

Figure 11:
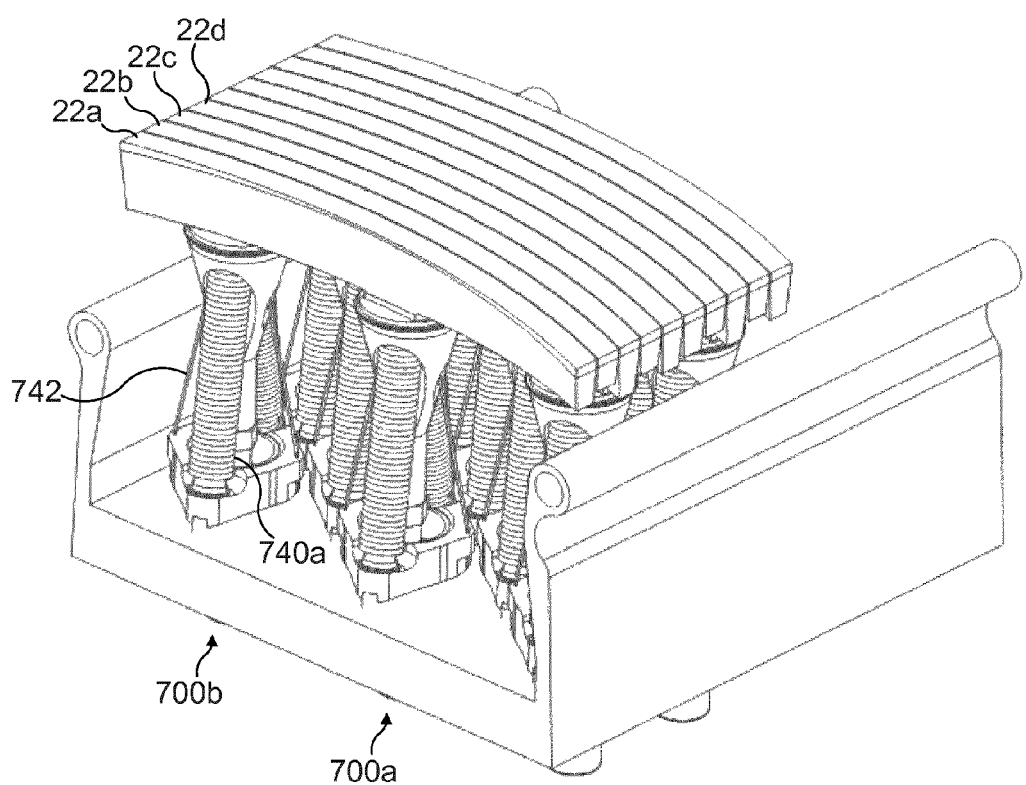
FIG. 11 is an external and partially cut away view of a field facet mirror module in a lithographic apparatus, the field facet mirror module including a number of actuation mechanisms according to an embodiment of the present invention.
Figure 12:
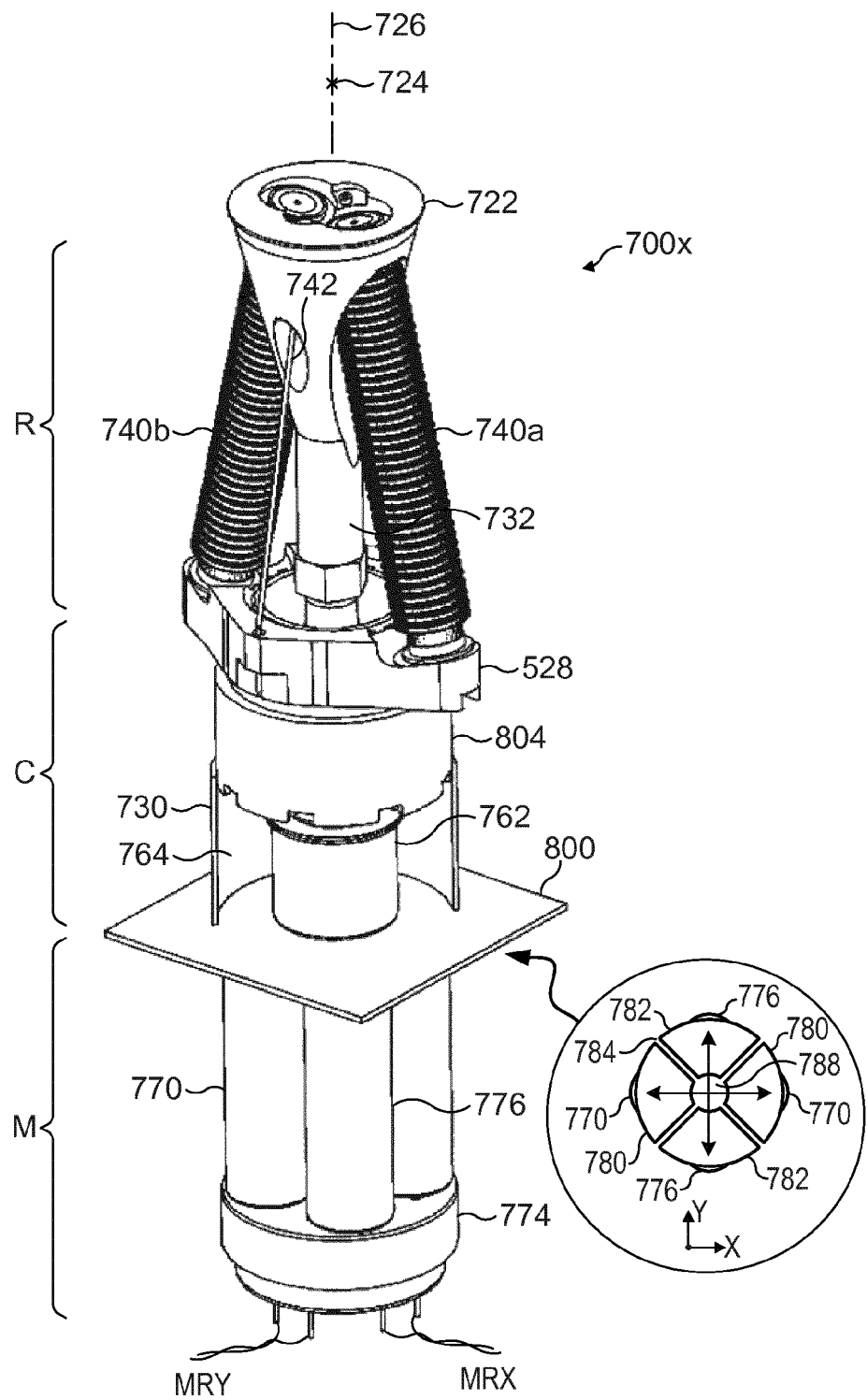
FIG. 12 is a more detailed view of one actuation mechanism in the mirror module of FIG. 11, with a shield part partially cut away.

FIGS. 11 and 12 illustrate an embodiment of the invention in which several actuators including motors of the general type shown in FIG. 7 are applied to effect movement of reflecting elements serving as facet mirrors 22a to 22d etc. in the illumination system of an EUV lithography apparatus such as the ones described above. Many features of this embodiment will be recognizable from their similarity to the embodiment illustrated in FIGS. 9 and 10. Features with reference numbers beginning '7' correspond generally to the features with reference numbers beginning '5' in FIGS. 9 and 10, while features with numbers beginning '8' correspond to those beginning '6' in FIGS. 9 and 10. Differences between the examples concern in particular a difference in the suspension part of the actuator, and some differences in the motor M. Controller CTL and drive circuits MDRVx can be the same as in the previous example.

Concerning the suspension, it will be seen that the single bellows 540 that enclosed the upper part of the mechanism in FIGS. 9 and 10 is replaced by two narrower bellows 740a and 740b extending between the actuator head 722 and two opposite sides of a chassis part 528. Four tendons 742, two of which are in the center of the bellows 740a and 740b, extend from anchoring points on the chassis part 528 to the head 722. As in the case of the three tendons 542 of the previous embodiment, the tendons 742 point towards the virtual pivot point 724, and define the x, y, z position of this point. The bellows 740a and 740b constrain the Rz degree of freedom. The mirror body 22x is omitted, for reasons of space. It will be understood that any component, not only a mirror, may be attached to the head 522 or 722 to be moved by an actuator of this type.

Therefore, where the embodiment of FIGS. 9 and 10 had a suspension arrangement comprising a tripod of tendons and a single bellows in compression, the suspension arrangement in this embodiment comprises a tetrapod of tendons in tension, and two bellows in V-shape that help prevent rotation around the Z axis. The tendons are uniformly spaced around the actuator's central (Z) axis 726. The suspension arrangement again provides two degrees of freedom for tilting the body 722 in direction Rx and Ry. Movement in the Z direction as well as translation in X and Y are substantially or completely prevented. The bellows 740a, 740b in this embodiment can be filled with Litz wire, or fluid filled so as to serve as thermal conductors instead of or in addition to the Litz wire 560 shown in the previous embodiment. They may also be constructed as heat pipes for greater heat conduction.

A further magnet (802, not shown) may be provided within a cavity in the chassis part 528, to provide magnet counter-bias as described above in relation to magnet 602.

Concerning the motor part of the actuator, this has again the form and function shown in FIG. 7. Moving magnet 762 is attached to the moving shaft 732 of the actuator 700x, and its movements are controlled by a first electromagnet comprising coils 770 for displacement in the X direction (rotation Ry) and a second electromagnet comprising coils 776 for displacement the Y direction (rotation Rx). A first difference between this embodiment and that of FIGS. 9 and 10 is that the motor has a single core base 774, similar to the core base 374 shown in FIG. 7, rather than separate cores 572 and 578 shown in FIGS. 9 and 10. This core base 774 is provided with an aperture to allow an optical sensor to measure the tilt of the actuator in at least two dimensions. The sensor, which is omitted from FIGS. 11 and 12 for clarity, can be of the form shown in FIGS. 7 and 8, or any other form. The position sensor can be provided at another place in the mechanism, if space permits.

Another difference from the embodiment of FIGS. 9 and 10 can be seen from the inset detail on FIG. 12, looking down onto the face of pole shoes 780, 782. As mentioned above, each pole face substantially fills a quadrant of an annulus, and that annulus in turn encompasses all desired positions of the moving magnet 762 within chamber 764. The pole shoes are not touching one another, to help ensure that they can be magnetized independently, but the gaps between them are limited to maximize coverage of the annular area. Similarly, the central opening is minimized, permitting just enough space for the optical position sensor to 'see' the moving magnet 762. It can be seen that the central opening 788 is drawn smaller in FIG. 12 than the central opening 588 in FIG. 10. Again, membrane 800 may be of glass or other material transparent to the radiation used by a position sensor. A locking nut 804 may be used to fix the V-shaped suspension assembly to the cooling plate (for example by screwing upwards in FIG. 12). In the examples illustrated, the radius of the central opening 788 is less than 25%, optionally less than 20% or 15% of the radius of the circle. Gaps 784 are used between the adjacent pole shoes so that the pole shoes are not connected pieces of ferromagnetic material. The aim of the design is to fill the circle as completely as possible, and each gap may be less than 10%, optionally 5% of the circle diameter. The gaps may be filled with spacers of non-ferromagnetic material, to help keep the pole shoes apart.

FIGS. 13 to 17 present three-dimensional plots of simulated performance of an example motor of the design shown in FIG. 7, for application in the actuators of FIGS. 11 and 12. The static part of the motor including shielding and casing has a diameter of 16 mm, and a length (from the pole faces) of around 30 mm.

Figure 13:
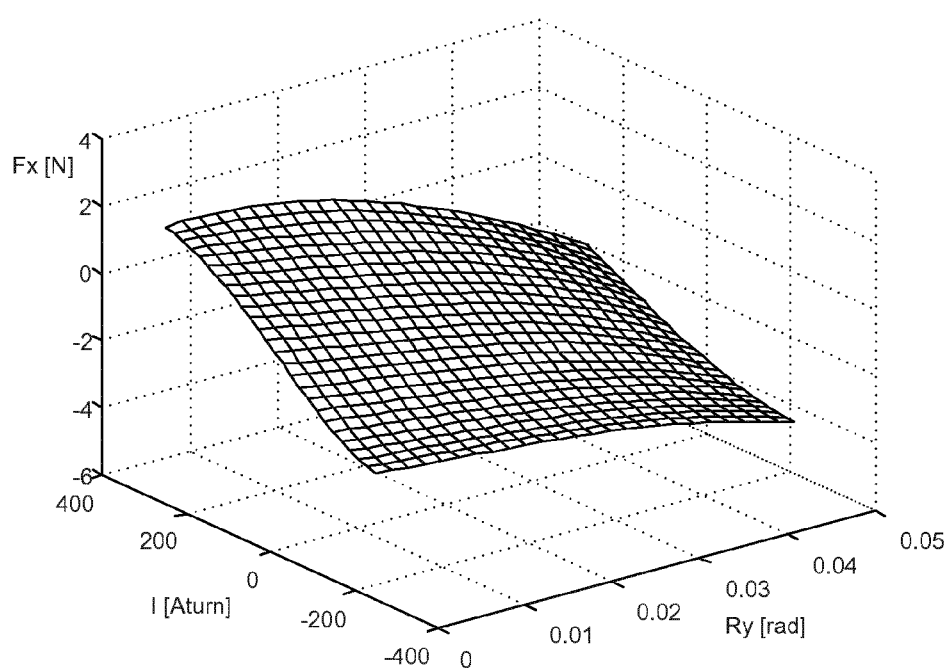
FIGS. 13 to 17 show simulated performance characteristics of the motor included in the actuator of FIG. 12.

In FIG. 13, the driving force Fx in one dimension (x, for example) is shown on a vertical axis, measured in newtons (N). The force may be negative or positive, depending on its direction. Different values of coil current (ranging from −250 to +250 ampere-turns) are shown by the left horizontal axis. This coil current corresponds to the coil driving signal MRY in FIGS. 7 to 12. The right horizontal axis shows different magnet positions in the driving direction. The right horizontal axis could be marked with linear displacement of the magnet, measured in millimeters, but has been converted for this example to show tilt angle Ry, measured in radians. The position Ry=0 corresponds to the position where the mover is exactly in the center position, and Ry=0.05 rad represents the utmost radial position in one direction. The equivalent displacement x of the magnet 362/762 might be 2.5 mm, for example, depending on the length of the actuator shaft 732. Since rotations are small (plus and minus 50 mrad), translations may be linearly scaled to obtain rotations. The pivot point in this example is located approximately 70 mm away from the radiation reflecting surface of the magnet 762.

The force shown in FIG. 13 includes the influence of the shielding attracting the magnet, but no contribution from any particular suspension or other counter-biasing arrangement. One can notice how the driving force varies for different current levels. From the Figure, it can be seen that the radial force (Fx) is increasingly negative for zero coil current, when moving away from the zero (central) position. As the design is four-way symmetrical about the actuator axis, it will be appreciated that the same performance can be expected over excursions in the negative Ry direction, and also in positive and negative Rx directions. Note that whether a force is positive or negative depends on the co-ordinate conventions used: positive and negative forces are simply forces in opposite directions.

Figure 14:
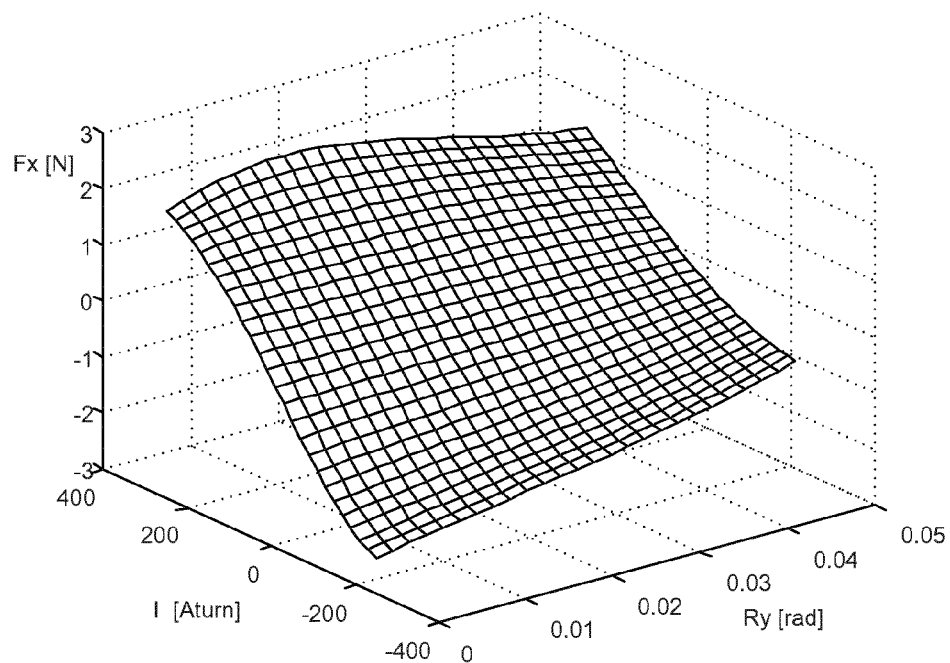

FIG. 14 shows purely the electromagnetic motor force, without the effect of the shielding. The graph demonstrates that the actuator works within the whole working area. However the motor force constant (Fx/I) drops with increased rotation Ry. This can be corrected for in the controller and/or drive circuits. This correction may be applied by a feed-forward correction, or the controller can handle this by increasing the drive current to achieve a desired position based on feedback from the position sensor. The servo control does not need to respond very rapidly, because settling times of the complete mechanism are relatively high, for example in the range 0.1 to 1 second.

Figure 15:
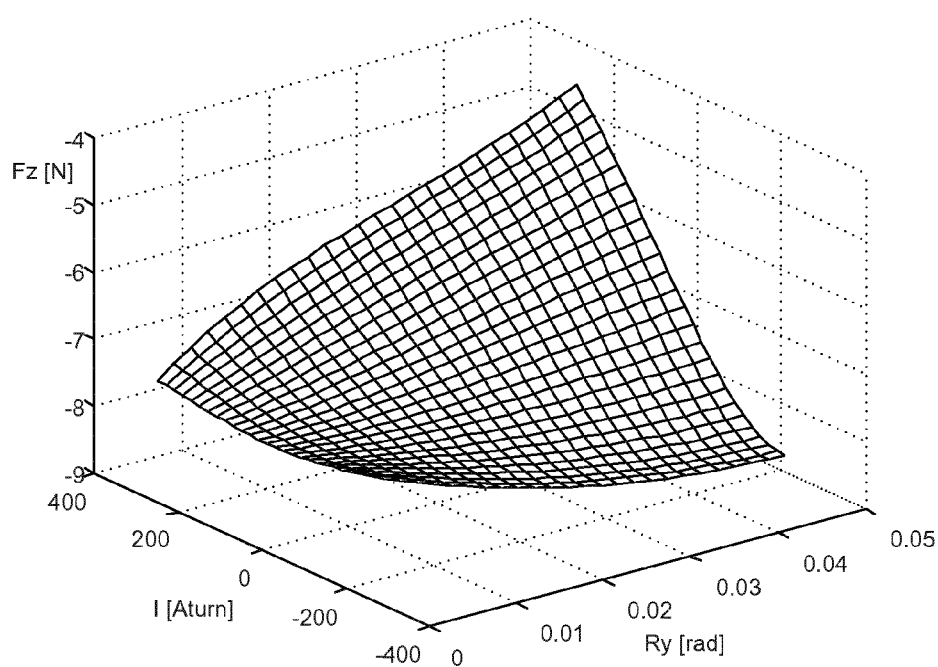

FIG. 15 shows the normal force Fz, pulling the magnet 362/762 toward the pole faces. The suspension, for example the bellows 740a, 740b, should be designed such to resist this normal force, and so maintain a desired gap 786 between the moving magnet and the pole faces.

Figure 16:
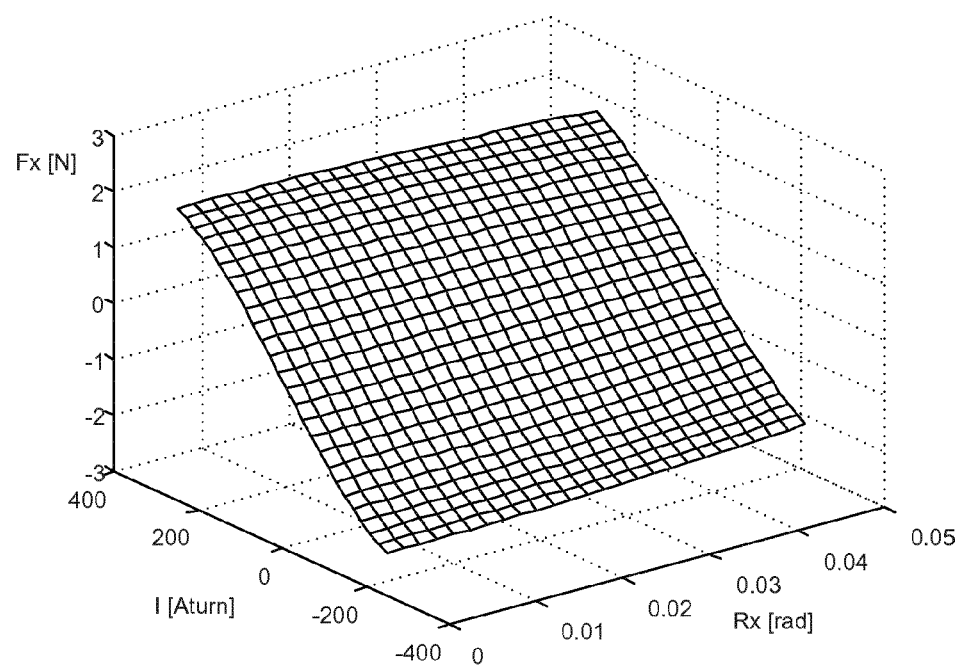
Figure 17:
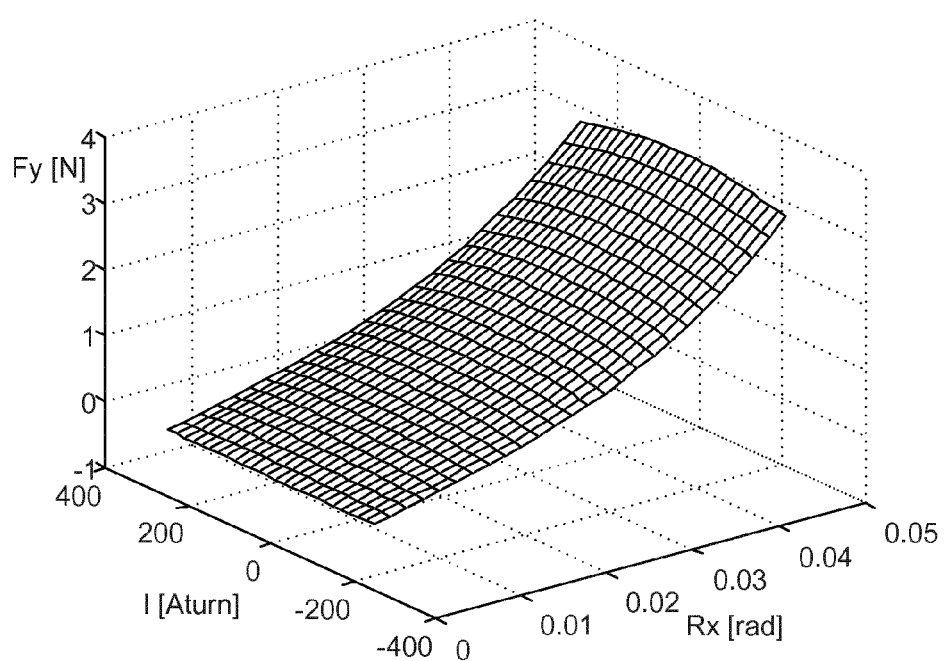

In order to allow independent control of the position in both x (Ry) and y (Rx) directions, the actuator's driving force should be independent of displacements perpendicular to the driving direction. In FIG. 16, the right horizontal axis is Rx, corresponding to a magnet displacement in direction Y, perpendicular to the driving force Fx. It can be seen that the driving force hardly changes at all when moving perpendicular to the force direction. FIG. 17 shows the force perpendicular to the driving direction as function of current and position. This force is substantially independent of the current, confirming that the actuator is purely generating a force in x-direction. Also from FIG. 17 we can see a force varying with the mover position in y (Rx) direction. This is the force due to the attraction of the ferromagnetic shield 730.

The same variations and modifications as discussed for the example of FIGS. 9 and 10 can be applied in the second example of FIGS. 11 and 12. Moreover, features of the different examples can be combined, for example to attach the motor of FIGS. 11 and 12 with the suspension arrangement of FIGS. 9 and 10.

Figure 18:
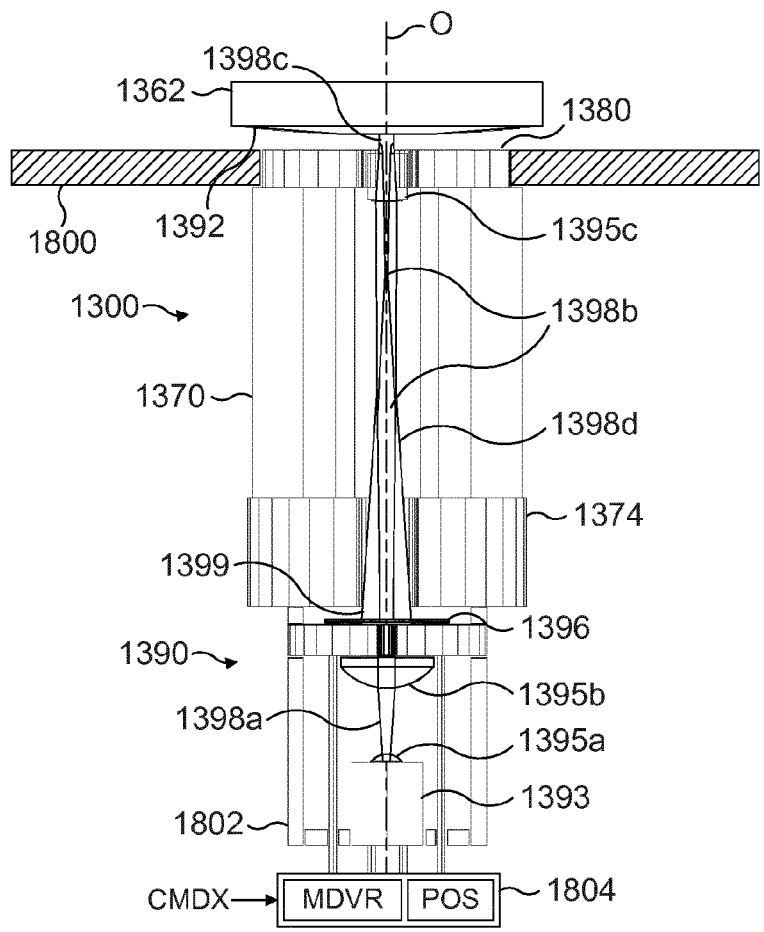
FIG. 18 illustrates the main components of a form of optical position sensor, that may be used in place of the one shown in FIG. 8.
Figure 19:
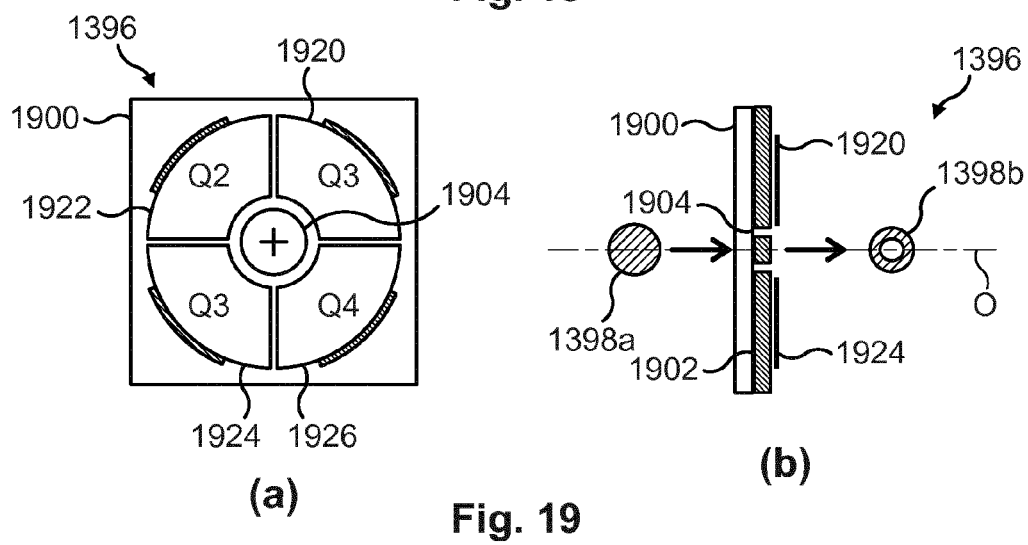
FIG. 19(a) illustrates a plan view of a detector part of the sensor of FIG. 18
FIG. 19(b) illustrates a cross sectional view of a detector part of the sensor of FIG. 18.
Figure 20:
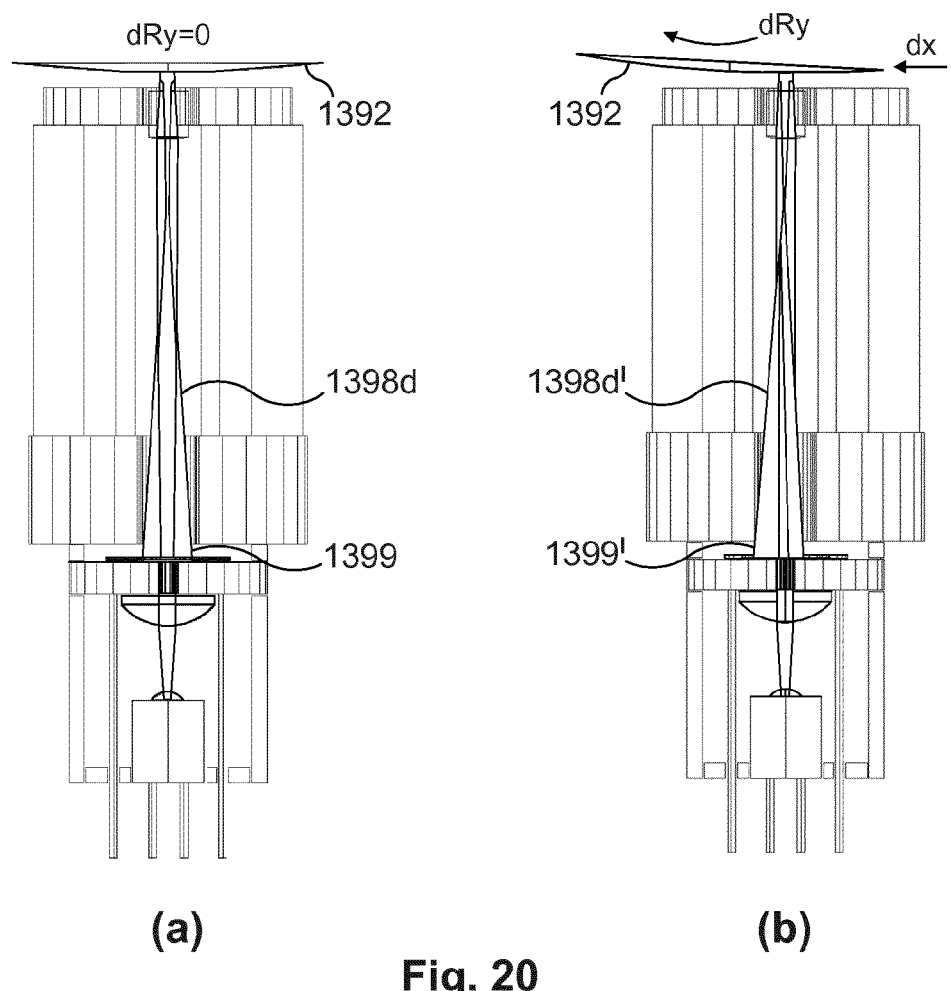
FIG. 20(a) shows a view of the optical position sensor of FIG. 18 with the actuator in a centered position and FIG. 20(b) shows a view of the optical position sensor of FIG. 18 with the actuator in a tilted position.
Figure 21:
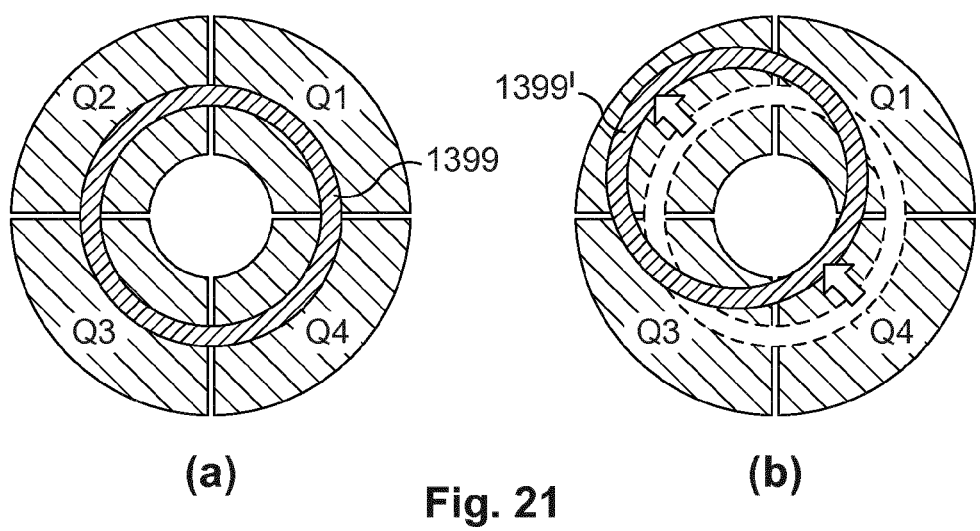
FIG. 21(a) shows the position of an annular radiation pattern on the detector of the optical position sensor, with the actuator in the centered position shown in FIG. 20(a)
FIG. 21(b) shows the position of an annular radiation pattern on the detector of the optical position sensor, with the actuator in the tilted position shown in FIG. 20(b)

FIGS. 18 to 21 present an embodiment of optical position sensor that may be used in place of the example sensor 390, shown in FIGS. 7 and 8. Referring to FIG. 18, parts corresponding to those shown in FIGS. 7 and 8 are labeled with the prefix '13' in place of '3'. Thus, the static part of the actuator motor is labeled 1300 and includes coils 1370 and core base 1374. The moving magnet of the motor is labeled 1362 and faces the pole shoes 1380. Shown in this illustration is a separating wall 1800, which separates the vacuum environment around the moving part from the non-vacuum environment in which the static part of the motor and the optical position sensor are provided.

As in the example of FIGS. 7 and 8, an optical path is provided through an aperture in the center of the core base 1374 and pole shoes 1380 through which the optical position sensor 1390 can illuminate a reflective surface 1392 on the moving magnet 1362. The components of the optical position sensor 1390 are as follows. Radiation output 1393 comprises for example a vertical cavity surface-emitting laser VCSEL having an exit lens 1395a. As will be seen, in contrast to the arrangement of FIG. 8, the radiation output 1393 in this modified embodiment is located on the optical axis of the sensor, and there is no beam splitter (394). A photodetector 1396 is provided with a central aperture, and surrounds the optical axis. A collimating lens 1395b is mounted between the output and the detector, so as to receive a slightly divergent beam 1398a from the output, and collimate it into a beam 1398b, extending towards the reflective surface 1392 that lies on the face of the moving magnet 1362 facing the pole shoes. The reflective surface 1392 in this example is convex. The reflective surface may be formed by a coating and/or polishing directly on the magnetic material of the moving magnet 1362, or on some layer added to the magnet, for example an encapsulation of the magnet.

In the plane of the wall 1800 and pole shoes 1380, a lens 1395c may be provided, through which beam 1398b passes to reach the reflective surface at 1398c. Lens 1395c may or may not have optical power. Its primary function is to serve as a window permitting the optical beams to pass between the vacuum and non-vacuum environments. After reflection from the surface 1392, radiation re-enters the lens 1395c and forms a beam 1398d, which passes back through the core base 1374 to form an annular radiation pattern at 1399, where it hits the photo detector 1396.

FIG. 19(a) shows the photo detector 1396 in plan view, while FIG. 19(b) shows the detector in a cross section parallel to the optical axis. Various forms of construction can be envisaged, and the following is only one example. Transparent substrate 1900 is provided, for example of glass or plastic. A mask 1902 blocks the radiation from radiation output 1393 except for an annular aperture 1904 that surrounds the optical axis O of the sensor. As shown in FIG. 19(b), circular illumination profile of the beam 1398a emitted by the output 1393 is thereby transformed into an annular illumination profile for the beam 1398b, which travels towards the reflective surface 1392. Instead of being formed on a separate substrate, the mask 1902 can be formed on the surface of an optical component, for example on the back surface of the lens 1395b. Instead of a simple mask having opaque and transparent portions, the annular illumination profile can alternatively be obtained using a diffractive optical element (DOE) as the mask 1902. A DOE can provide the desired profile while using more of the output radiation, whereas a simple mask blocks the most intense, central portion of the beam 1398a. Surrounding this annular aperture on the substrate 1900 is the photosensitive part of the detector module, in this case, a "quad cell" having four photodetector elements 1920 to 1926. The photodetector elements each occupy substantially one quadrant of a circle surrounding the aperture. The quadrants can be labeled for example Q1 to Q4. The optical design of the system comprising elements 1393, 1395a, 1395b, 1395c and 1392 is such that, in operation the ring-shaped aperture 1904, after reflection by surface 1392, is imaged with a certain magnification to form a ring image 1399 onto the "quad cell" formed by the photodetector elements 1920-1926.

FIG. 20(a) is a copy of FIG. 18, and shows the path of the annular beam 1398b, when the reflecting surface 1392 is in its untilted position, indicating that the moving magnet 1362 of the actuator is centered. FIG. 20(b), on the other hand, shows the situation in which the reflective surface 1392 is tilted, indicating that the actuator has moved to an off-center position with a certain angle dRy or displacement dx. Due to the curvature of the reflective surface, the angle of deflection of the beam is less than two times the angular deflection dRy. As a consequence of the deflection, the ring of radiation 1399 moves from its centered position to an off-centered position 1399'—shown in FIG. 20(b). It will be appreciated that in fact the drawing shows a situation in which we have rotation in two directions: dRx and dRy are both non-zero.

FIG. 21(a) shows schematically the position of the ring image 1399 in the centered position on the photo sensitive elements, and FIG. 21(b) shows schematically the position of the ring image 1399 in the off-centered position. In one example, the actuator core base 1374 has a central aperture of 4 mm diameter and a length of 30 mm. The tilt-range is from −3 to +3 degrees, while the range of movement of the ring image is reduced by applying curvature of radius 105 mm or so to the reflective surface 1392. This radius of 105 mm is still larger than the distance of the pivot point of the convex mirror to the mirror surface of this mirror (this distance is about 70 mm), but significantly smaller than the infinite radius of a flat mirror. Note that for a mirror radius equal to the distance pivot point—mirror surface (in the example case 70 mm), the ring image will not move at all when the mirror is rotated. Thus the choice for the radius of curvature determines the trade-off between measurement range and resolution. A high resolution of position measurement, for example 1 in 2500, is achieved in this practical example by the choice of the radius of curvature mentioned above and using photovoltaic detectors as the photosensitive elements 1920-1926. Each element then produces a current that is linearly related to the radiation energy falling on its area. Such quad cells are known generally, though without the central aperture and ring-shaped illumination. Alternative types of photosensitive elements may be used, such as the position-sensitive device (PSD) or pixel array sensor mentioned for use in the example of FIG. 8. However, photovoltaic cells have very good noise characteristics and speed of response.

By simple arithmetic combinations of signals from the four elements 1920-1926, position X, Y signals can be calculated. If the photocurrents from the four quadrant sensors are represented by signals Q1 to Q4, signals representing X and Y displacement can be simply derived as ratios:

$$X=((Q1+Q4)-(Q2+Q3))/(Q1+Q2+Q3+Q4)$$

$$Y=((Q1+Q2)-(Q3+Q4))/(Q1+Q2+Q3+Q4)$$

When the ring image 1399 is centered as shown in FIG. 21(a), all quadrants receive equal radiation and the values for X and Y are zero. When the ring image 1399' moves off-center, as shown in FIG. 21(b), the X and/or Y values will increase in a positive or negative way, according to the direction and magnitude of displacement. Note that this ratio form of calculation automatically removes any variation in the overall intensity of the illumination source, detector sensitivity and the like. It will be appreciated that the raw X, Y signals derived from the quad cell signals may not relate linearly to angular displacement dRx, dRy. Signal processing can be applied, and a calibration relationship can be stored to convert angular position of the mirror to the raw X, Y values calculated by the above formulae. Alternatively or in addition, the desired raw X, Y values for each desired positions of the mirror can be directly memorized, so that a linearizing calibration is not necessary. These different types of calibration can be implemented by design, or can be obtained during a set-up process when the illumination system is assembled. Signal processing can be performed in the analog domain, the digital domain or a mixture of both.

The size of the ring image 1399 at the detector can be tuned by changing the powers of the lenses 1395a, 1395b and/or 1395c. Aims of the design are to maximize the range of travel of the ring image without allowing the reflected radiation to impinge on the surrounding components of the motor, or re-enter the aperture at the center of the detector 1396. Allowing even a small portion of radiation to be reflected back into the laser-type source 1393 can disrupt its operation. The dark portion at the center of the annular illumination profile allows this to be avoided while permitting the co-axial arrangement of source and detector. Lens 1395a may be a part of a commercially-available VCSEL module, whereas the lenses 1395b, 1395c can be tailored to the specific requirements of the tilt sensing application. Lens 1395b can however be integrated into a module with a VCSEL, relaxing the tolerances for assembly of the overall system. FIG. 21(b) thus shows the maximum excursion. By using a convex reflective surface 1392, the range of excursion of the ring image 1399 can be tuned by changing the convex radius of curvature.

In other variants, reflective surface may be formed by the back of the field facet mirror itself, or a mirror which is mechanically fixed to the field facet mirror. The tilt sensor of FIGS. 18-21 can be applied in other applications, besides a faceted mirror. In the illustrated embodiment, the actuator motor 1300 and the sensor 1390 are located on top of one another, within a shared housing 1802, so that the complete control-loop (position calculation module POS and motor drive circuitry MDRV similar to that shown in FIG. 7) can be implemented locally within a self-contained module 1804 within or attached to the same housing. That is to say, only the position command CMDx for facet x needs be delivered to the actuator module, which then includes within it all components necessary to implement the position calculation, motor drive circuits and feedback control. This greatly reduces the number of electrical connections into the illuminator, particularly when one considers an embodiment with tens or hundreds of facet mirrors and actuators.

The modified sensor 1390 may have a number of advantageous features. For high-resolution it can be arranged that the radiation, which reflects from the tilted reflecting surface 1392, does not hit the actuator walls and does not miss the detector. The optical tilt sensor may be mounted coaxially with the actuator, so that it can be made compact and cheap with simple optical components. Moreover, by avoiding that reflected radiation can re-enter the radiation output, a laser such as a VCSEL can be used, rather than for example a conventional LED source. Other types of radiation source can be used, but VCSELs are attractive for this application in that they naturally provide a collimated, radially symmetric beam, operate at very low power and are very durable. The lenses for example can be made of PMMA. In one example having the dimensions given above, the optical part of the position detector 1390 can be made less than 20 mm long, which is much shorter than in the FIG. 8 embodiment. This frees up space for example to make the whole assembly shorter, or to include signal processing and drive electronics.

The sensor can be applied to measure tilt of any moving part in a wide range of applications. The sensor directly measures tilting of the reflecting surface, which may be associated with tilting (angular) motion of the moving part, or with translational motion. The sensor having a curved reflective surface is sensitive to both tilt and translation of the body which carries the reflective surface. In the case of the moving magnet 1362, for example, the angle at which the beam is reflected will be influenced by decentering of the optical axis of the convex mirror 1392, as well as by the angular displacement which is intended to be measured. Since the sensor in combination with the curved reflecting surface cannot distinguish between the effects of tilt and the effects of translation, the intended use of the sensor is applications with only tilt, with only translation or with a fixed proportionality between tilt and translation. In the above described embodiment the displacement is strictly proportional to the tilt (due to the pivot point around which the target mirror 1392 is rotated) and the combination of both effects results in the correct determination of the tilt angle. Due to the fixed proportionality, instead of the tilt of mirror 1392, also its off-axis translation could have been calibrated. It happens that in the example application of an actuator for a field facet mirror 22x, it is the tilt that is of most interest.

Components of the actuator should be specified according to the application and environment in which it will operate. For the environment inside an EUV apparatus, considerations include vacuum compatibility (with substantially no outgassing), and tolerance of a low pressure gas, such as hydrogen atmosphere (partial pressure for example 2 to 20 Pa). This may influence the choice of magnet material. For example, SmCo may be used for the moving magnet material. Other materials, such as FeNdB, may suffer $H_2$ embrittlement unless encapsulated. Encapsulation will increase the gap 586, 786 undesirably, and introduces the risk of leakage.

In accordance with embodiments of the invention, the novel motor can be designed successfully to generate planar driving forces in a controlled system with feedback. The concepts presented herein may allow a system designer to: provide a controllable driving force in two degrees of freedom; restrict the stray fields when several actuators are mounted side-by-side; reduce the driving force as an additional advantage of magnetic shielding; work within very limited volume, for example to a width of 10-20 mm, e.g. 16 mm and height of 20-40 mm, e.g. 30 mm; limit power dissipation, for example to less than 5 W or less than 3 W per actuator; and/or limit the power consumption.

A wide variety of EUV illumination profiles can be achieved by controlling pupil facet mirrors 22 using an array of actuators of the type disclosed herein. There may be five or more pupil facets 24x, etc. available to be illuminated by each field facet mirror 22x. The illumination profiles include a variety of annular and part-annular profiles, as well as dipole and quadrupole profiles. The use of these profiles tailored to particular patterns and/or process parameters allows better patterning performance in the EUV apparatus employing the actuators. However, the increase in the degree of freedom of the field facet mirrors and of the number of the pupil facets associated to a single field facet mirror makes it a challenge to focus radiation equally well onto all of the associated pupil facet mirrors (due to different distances).

Figure 22:
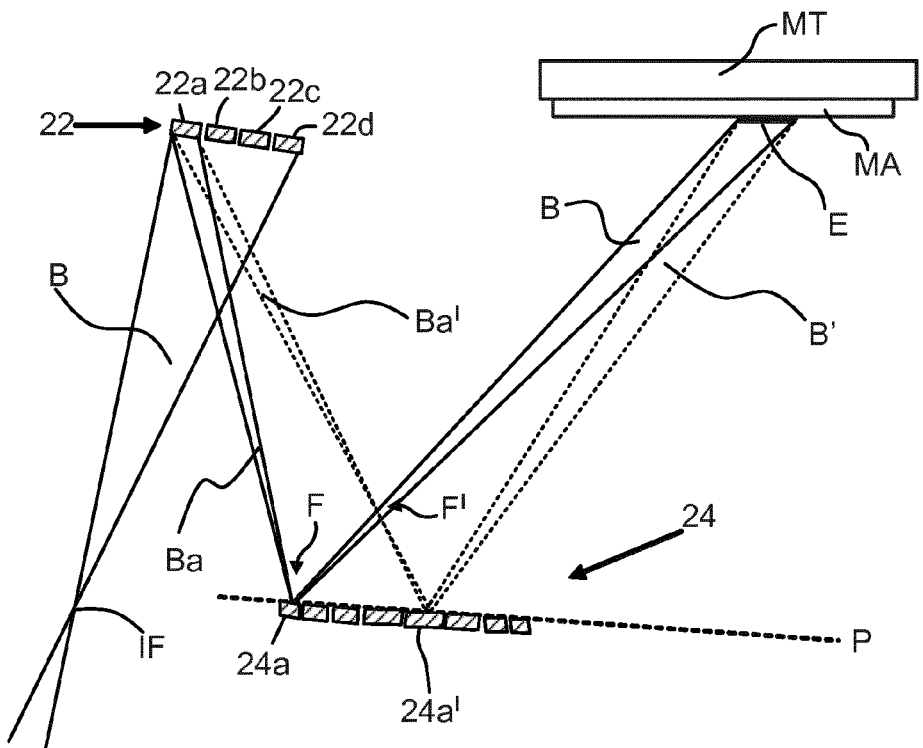
FIG. 22 is a view of the illumination system of FIG. 5 in a modified embodiment.
Figure 23:
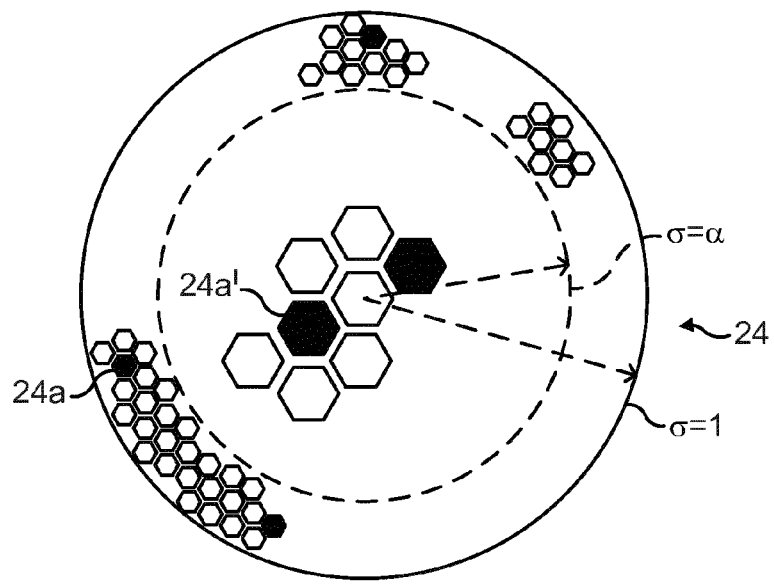
FIG. 23 is a plan view of a pupil mirror device in the modified embodiment of FIG. 22.

FIG. 22 shows the illumination system of an EUV lithographic apparatus in another embodiment. The faceted field mirror device 22 and the faceted pupil mirrored device 24 are again shown. Also again shown is the effect of tilting one of the field facet mirrors 22a, so as to illuminate the target area E from a selected one of the pupil facets 24a and 24a'. As mentioned already, using the 2D planar actuator disclosed in this application, each of the field facets 22a can be associated with more than two pupil facets. FIG. 23 shows schematically a faceted pupil mirror device 24 suitable for use in such a system, having a number of hexagonal pupil facets. Hexagonal facets are only one possible example. Other shapes such as square, triangular, rectangular and circular are possible, and shapes may be mixed within a faceted field mirror device.

Each combination of field facet and pupil facet forms a "channel" for radiation to reach the target area E. For each desired illumination mode (illumination profile), selected channels are activated to control the shape of the bright areas of the pupil, and to optimize uniformity of illumination across the bright areas. In a practical system providing a high-NA illumination system (with a numerical aperture NA of at least around 0.4), there may be several hundred field facet mirrors, and each field facet mirror may have associated with it three or more pupil facets, for example four, five or six pupil facets may be selectable by moving a single pupil facet. (The number of associated pupil facets can be different for different field facets.) Multiplying the number of pupil facets associated with each field facet in this way allows a wider range of illumination profiles to be provided by the illumination system. However, it also brings design challenges.

For increased imaging resolution, illumination profiles such as "sharp dipole" and "sharp quadrupole" are of interest, in which the bright parts of the illumination profile are confined to a small fraction of the total pupil area. (This fraction is commonly referred to as the "pupil fill ratio".) These bright regions may be confined for example to peripheral regions of the pupil and only on the X or Y axis (X dipole or Y dipole). Conventionally, because the pupil facets have a certain size, the only way to achieve this very confined distribution of the bright facets is to discard some of the radiation using a "tri-state" position of the field facet. That is to say, only a subset of the possible channels are used. In general, the illumination energy is precious, and it is undesirable to discard it. To use a full set of channels in these "sharp" illumination modes involves several hundred pupil facet mirrors to be located within the peripheral area (or other localized area, depending on the illumination mode). This implies that each pupil facet mirror 24a, 24a' etc. is very small in size, which in turn implies that the corresponding field facet mirror 22a must focus an image of the intermediate focus IF to a very small size in order to avoid radiation spilling off the side of the facet. Even if the radiation can be focused to a size slightly smaller than the pupil facet mirror, any fluctuation or drift in the plasma position or shape may cause some of the radiation to spill over an edge of the facet. This is undesirable as it introduces variations in intensity and so degrades the uniformity of exposure dose during operation. Moreover, when each field facet mirror is associated with several pupil facet mirrors distributed in two dimensions over the pupil mirror device 24, it becomes difficult or impossible to arrange that the field facet mirror can produce a focused image of the radiation source (IF) on every one of the associated pupil facets. The focusing distance of each field facet mirror 22a, 22b is determined by its radius of curvature, while the distances from the field facet mirror to the different associated pupil facet mirrors will be different. Unless a variable radius of curvature is provided for a field facet mirror, its focusing distance will be fixed, implying that not all of the pupil facets can receive a perfectly focused image of the radiation source.

The modified illumination system illustrated in FIGS. 22 and 23 may address one or more these problems and may allow a full set of channels to be used in all modes of illumination, including those with small fill ratio, without sacrificing radiation and dose uniformity in other modes. To achieve this, it is arranged that certain pupil facets are smaller in size than others. In particular, facets in a peripheral region are much smaller than in a central region, because it is typically the peripheral region that is wanted in the "sharp" illumination profiles having the low pupil fill ratio. At the same time, facets in other regions are made relatively large. Because even a blurred image will still fit on the relatively large facet, this has the benefit of relaxing the focusing requirement. In one example, the outer radius of the pupil is defined by a value $\sigma=1$ and the center of the pupil is defined as $\sigma=0$, and the smaller facets are located in a region with $\sigma$ greater than a parameter $\alpha$. Thus, pupil facet 24a is much smaller than facet 24a'.

In FIG. 23, two of the many pupil facets are labeled 24a and 24a', and shaded black. Other facets shaded black in FIG. 23 are also associated with the same field facet mirror 22a. As can be seen, a total of five pupil facets are associated with single field facet 22a. Given that there may be for example between 1000 and 2000 field facet mirrors, it will be appreciated that the facets in practice will be even smaller and more numerous than illustrated here. As can be seen in FIG. 22, field facet mirror 22a is designed to form a focused image of the radiation source (IF) at point F which lies as exactly as possible on the pupil facet mirror 24a. When tilted to address the pupil facet mirror 24a', which is at a farther distance, the image is focused at a point F' which falls short of the pupil facet mirror 24a'. Therefore the image at the pupil facet mirror 24a' is defocused and consequently larger than that on the mirror 24a. Since the mirror 24' is physically larger, however, all the radiation is still captured and directed to target area E, so that radiation utilization and uniformity are not so badly compromised. In the design process for the illuminator, which determines the channel assignments for every intended illumination profile, the radius of curvature (focusing power) of each field facet mirror can be optimized so that focusing is best for those channels having a small pupil facet mirror (e.g. 24a), while a degree of defocus is permitted for the channels having larger pupil facet mirrors (e.g. 24a').

The modifications described in FIGS. 18 to 21 and in FIGS. 22 and 23 can each be used together in one apparatus with any of the actuator designs shown in FIGS. 7 to 17. The optical sensor of FIGS. 18 to 21 can be used in many applications independently of the particular actuators. Similarly, the novel faceted pupil mirror device shown in FIGS. 22 and 23 can be applied in illumination systems without necessarily using the particular forms of actuator. Instead of providing only two sizes of pupil facet mirror, a range of sizes can be used in different regions of the pupil.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of EUV optical systems, it will be appreciated that the invention may be used in other applications, whether in optical systems, whether in lithography or completely different applications, and whether in vacuum or other environments.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

What is claimed is:

1. An actuation mechanism to provide movement with at least two degrees of freedom, the mechanism comprising a moving part and a static part, the moving part including a permanent magnet with a magnetic face constrained by a suspension that couples the moving part and the static part to move over a working area lying substantially in a first plane perpendicular to a direction of magnetization of the magnet, the static part comprising at least two electromagnets having pole faces lying substantially in a second plane closely parallel to the first plane, the pole faces being symmetrically distributed around a central position in the second plane and extending over substantially the whole area traversed by the face of the moving magnet.

2. The mechanism as claimed in claim 1, wherein each electromagnet is a bipolar electromagnet having first and second pole faces located diametrically opposite one another in the second plane.

3. The mechanism as claimed in claim 1, wherein the number of electromagnet pole faces is four, each of the pole faces has substantially the form of a quadrant of a circle or annulus, the pole faces together substantially covering a circular or annular area in the second plane.

4. The mechanism as claimed in claim 1 having an elongate form with a longitudinal axis perpendicular to the first and second planes, wherein the moving part is constrained to tilt about first and second axes orthogonal to the longitudinal axis when the magnet moves over the working area.

5. The mechanism as claimed in claim 1, wherein a gap between the face of the permanent magnet and the pole faces of the electromagnets is less than 20% of the width of the magnet face.

6. The mechanism as claimed in claim 5, wherein the gap between the face of the permanent magnet and the pole faces of the electromagnets is less than 15% of the width of the magnet face.

7. The mechanism as claimed in claim 6, wherein the gap between the face of the permanent magnet and the pole faces of the electromagnets is less than 10% of the width of the magnet face.

8. The mechanism as claimed in claim 1, wherein each pole face is located on the distal end of an elongate ferromagnetic core of its respective electromagnet, and wherein the cores for diametrically opposite pole faces have proximal ends connected together by ferromagnetic material.

9. The mechanism as claimed in claim 8, wherein proximal ends of all the cores are connected via a common ferromagnetic base.

10. The mechanism as claimed in any claim 1, further comprising a ferromagnetic shield surrounding at least the permanent magnet so as to shield it from magnetism when a plurality of such actuation mechanisms are placed side-by-side.

11. The mechanism as claimed in claim 1, further comprising a position sensor configured to monitor a position of the moving part to enable feedback control of the position, the position sensor configured to direct a beam of radiation at a reflective surface arranged to move with the moving part of the mechanism and to detect deflection of a beam of radiation reflected from the reflective surface.

12. The mechanism as claimed in claim 11, wherein the reflecting surface is on the moving magnet and the position sensor is configured to direct the beam of radiation at the moving magnet through a central space between the electromagnets and to detect deflection of the beam of radiation reflected from the moving magnet through the same central space.

13. The mechanism as claimed in claim 11, wherein the position sensor is configured to direct the beam of radiation along an optical axis, wherein an output of the directed beam of radiation is located on the optical axis while a photo detector configured to detect the reflected radiation beam surrounds the optical axis so that the directed beam passes through the center of the photodetector.

14. The mechanism as claimed in claim 13, wherein the photodetector comprises a plurality of photosensitive elements spaced around the optical axis.

15. The mechanism as claimed in claim 13, wherein the directed beam of radiation has an annular intensity profile that is dark around the optical axis, such that reflected radiation is substantially not directed back to the output of the directed beam of radiation.

16. The mechanism as claimed in claim 11, wherein the reflecting surface is curved.

17. The mechanism as claimed in claim 1, wherein the moving magnet comprises SmCo material.

18. The mechanism as claimed in claim 1 in an elongate form, wherein a suspension section, the permanent magnet, the static part and a position sensor are stacked end-to-end.

19. The mechanism as claimed in claim 1, wherein the moving part is supported by a resilient support arranged to provide a biasing force increasing in response to relative displacement between first and second parts and opposing a motive force, the mechanism further comprising a magnetic coupling between the first and second parts, the magnetic coupling being arranged to provide a counter-biasing force, the counter-biasing force partly opposing the biasing force to reduce the motive force used to effect a given displacement.

20. An optical apparatus comprising a series of optical components arranged to receive a radiation beam from a radiation source to process and deliver the beam to a target location, wherein the optical components include one or more movable optical components mounted on an actuator mechanism configured to provide movement with at least two degrees of freedom, the mechanism comprising a moving part and a static part, the moving part including a permanent magnet with a magnetic face constrained to move over a working area lying substantially in a first plane perpendicular to a direction of magnetization of the magnet, the static part comprising at least two electromagnets having pole faces lying substantially in a second plane closely parallel to the first plane, the pole faces being symmetrically distributed around a central position in the second plane and extending over substantially the whole area traversed by the face of the moving magnet, wherein the optical apparatus further comprises a controller and drive circuitry configured to energize the electromagnets to achieve a desired positioning of the or each movable optical component.

21. The optical apparatus as claimed in claim 20, wherein the one or more movable optical components form part of an illumination system configured to condition the beam and deliver it to a target location on a patterning device, and the movable component is movable to vary an incidence angle of the conditioned beam at the target location.

22. The optical apparatus as claimed in claim 21, comprising a plurality of such movable components with associated actuation mechanisms provided as part of a fly's eye illuminator.

23. The optical apparatus as claimed in claim 22, wherein the movable components comprise field facet mirrors in a faceted field mirror device within the fly's eye illuminator, each movable field facet mirror controllable to direct a portion of the beam to a selected one of several associated pupil facet mirrors in a faceted pupil mirror device, and the several pupil facet mirrors are of different sizes, according to their position in the pupil mirror device.

24. The optical apparatus as claimed in claim 23, wherein pupil facet mirrors in a peripheral region of the pupil mirror device are smaller than those in a central region.

25. The optical apparatus as claimed in claim 23, wherein each field facet mirror has a focusing power so as to focus an image of a radiation source onto the selected pupil facet mirror, the accuracy of the focusing varying between the different associated pupil facet mirrors that can be selected, and wherein larger ones of the associated pupil facet mirrors are located where the accuracy of focusing the image is lower.

26. The optical apparatus as claimed in claim 20, wherein the optical components are reflective components and the illumination system is an EUV illumination system operable with radiation with a wavelength in the range of 5 to 20 nm.

27. A lithographic apparatus, comprising:
- an illumination system configured to condition a radiation beam;
- a support constructed to support a patterning device, the patterning device capable of imparting the radiation beam with a pattern in its cross-section to form a patterned radiation beam;
- a substrate table constructed to hold a substrate;
- a projection system configured to project the patterned radiation beam onto a target portion of the substrate; and
- an optical apparatus configured to condition the radiation beam in the illumination system and/or the patterned radiation beam in the projection system, the optical apparatus comprising a series of optical components arranged to receive a radiation beam from a radiation source to process and deliver the beam to a target location, wherein the optical components include one or more movable optical components mounted on an actuator mechanism configured to provide movement with at least two degrees of freedom, the mechanism comprising a moving part and a static part, the moving part including a permanent magnet with a magnetic face constrained to move over a working area lying substantially in a first plane perpendicular to a direction of magnetization of the magnet, the static part comprising at least two electromagnets having pole faces lying substantially in a second plane closely parallel to the first plane, the pole faces being symmetrically distributed around a central position in the second plane and extending over substantially the whole area traversed by the face of the moving magnet, wherein the optical apparatus further comprises a controller and drive circuitry configured to energize the electromagnets to achieve a desired positioning of the or each movable optical component.

28. A lithographic projection apparatus arranged to project a pattern from a patterning device onto a substrate, wherein the lithographic projection apparatus includes an optical apparatus to condition a radiation beam which is used to illuminate the patterning device, the optical apparatus comprising a series of optical components arranged to receive a radiation beam from a radiation source to process and deliver the beam to a target location, wherein the optical components include one or more movable optical components mounted on an actuator mechanism configured to provide movement with at least two degrees of freedom, the mechanism comprising a moving part and a static part, the moving part including a permanent magnet with a magnetic face constrained to move over a working area lying substantially in a first plane perpendicular to a direction of magnetization of the magnet, the static part comprising at least two electromagnets having pole faces lying substantially in a second plane closely parallel to the first plane, the pole faces being symmetrically distributed around a central position in the second plane and extending over substantially the whole area traversed by the face of the moving magnet, wherein the optical apparatus further comprises a controller and drive circuitry configured to energize the electromagnets to achieve a desired positioning of the or each movable optical component.

29. A device manufacturing method comprising projecting a patterned beam of radiation onto a substrate, wherein the patterned beam is formed from a radiation beam which is conditioned by an optical apparatus comprising a series of optical components arranged to receive a radiation beam from a radiation source to process and deliver the beam to a target location, wherein the optical components include one or more movable optical components mounted on an actuator mechanism configured to provide movement with at least two degrees of freedom, the mechanism comprising a moving part and a static part, the moving part including a permanent magnet with a magnetic face constrained to move over a working area lying substantially in a first plane perpendicular to a direction of magnetization of the magnet, the static part comprising at least two electromagnets having pole faces lying substantially in a second plane closely parallel to the first plane, the pole faces being symmetrically distributed around a central position in the second plane and extending over substantially the whole area traversed by the face of the moving magnet, wherein the optical apparatus further comprises a controller and drive circuitry configured to energize the electromagnets to achieve a desired positioning of the or each movable optical component.

* * * * *